(12) United States Patent
Toh et al.

(10) Patent No.: US 9,882,125 B2
(45) Date of Patent: Jan. 30, 2018

(54) SELECTOR DEVICE FOR A NON-VOLATILE MEMORY CELL

(71) Applicant: GLOBALFOUNDRIES Singapore Pte. Ltd., Singapore (SG)

(72) Inventors: Eng Huat Toh, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/040,981

(22) Filed: Feb. 10, 2016

(65) Prior Publication Data
US 2016/0233333 A1    Aug. 11, 2016

Related U.S. Application Data

(60) Provisional application No. 62/114,598, filed on Feb. 11, 2015.

(51) Int. Cl.
| | |
|---|---|
| *H01L 27/22* | (2006.01) |
| *H01L 43/12* | (2006.01) |
| *H01L 29/78* | (2006.01) |
| *H01L 29/165* | (2006.01) |
| *H01L 29/06* | (2006.01) |

(52) U.S. Cl.
CPC ............ *H01L 43/12* (2013.01); *H01L 27/228* (2013.01); *H01L 29/165* (2013.01); *H01L 29/7834* (2013.01); *H01L 29/7848* (2013.01); *H01L 29/0669* (2013.01)

(58) Field of Classification Search
CPC ... H01L 29/7833; H01L 27/226; H01L 43/12; H01L 29/0669; H01L 29/7845
See application file for complete search history.

(56) References Cited

U.S. PATENT DOCUMENTS

| | | | | |
|---|---|---|---|---|
| 5,659,194 A | * | 8/1997 | Iwamatsu | ......... H01L 21/26506 257/377 |
| 7,208,397 B2 | * | 4/2007 | Feudel | .............. H01L 21/26586 257/E21.345 |

(Continued)

OTHER PUBLICATIONS

Sri Harsha Choday et al., Write-Optimized STT-MRAM Bit-Cells Using Asymmetrically Doped Transistors, IEEE Electron Device Letters, Nov. 2014, vol. 35, No. 11, IEEE.

(Continued)

*Primary Examiner* — Jarrett Stark
(74) *Attorney, Agent, or Firm* — Horizon IP Pte Ltd.; Dexter Chin

(57) ABSTRACT

Memory cells and methods of forming memory cells are disclosed. The memory cell includes a substrate and a select transistor. The select transistor includes a gate disposed over the substrate between first and second source/drain (S/D) terminals. The first and second S/D terminals are configured such that a resistance at the second S/D terminal is higher than a resistance at the first S/D terminal. A dielectric layer disposed over the substrate includes a plurality of inter level dielectric (ILD) layers. A lower portion of the dielectric layer includes a first contact level and a first metal level. A first contact plug disposed within the first contact level connects the first S/D terminal to a first metal line in the first metal level. A magnetic tunnel junction (MTJ) element is disposed directly on and in contact with a top of the first metal line.

20 Claims, 40 Drawing Sheets

(56) References Cited

U.S. PATENT DOCUMENTS

| | | | | |
|---|---|---|---|---|
| 2004/0087163 | A1* | 5/2004 | Steimle | B82Y 10/00 438/694 |
| 2007/0069296 | A1* | 3/2007 | Park | H01L 27/228 257/351 |
| 2007/0164381 | A1* | 7/2007 | Ho | H01L 27/228 257/421 |
| 2008/0026529 | A1* | 1/2008 | White | H01L 21/823814 438/275 |
| 2008/0308887 | A1* | 12/2008 | Asao | B82Y 10/00 257/421 |
| 2011/0108918 | A1* | 5/2011 | Yin | H01L 21/26586 257/347 |
| 2012/0074511 | A1* | 3/2012 | Takahashi | H01L 27/228 257/427 |
| 2013/0001716 | A1* | 1/2013 | Yamakawa | H01L 43/12 257/421 |
| 2013/0221308 | A1* | 8/2013 | Toh | H01L 45/04 257/2 |
| 2014/0077319 | A1* | 3/2014 | Noma | H01L 43/02 257/421 |
| 2014/0110765 | A1* | 4/2014 | Murali | H01L 21/28088 257/288 |
| 2014/0198564 | A1* | 7/2014 | Guo | G11C 11/161 365/158 |
| 2014/0210025 | A1* | 7/2014 | Guo | A63F 13/10 257/421 |
| 2015/0129975 | A1* | 5/2015 | Zheng | H01L 45/04 257/379 |
| 2015/0171186 | A1* | 6/2015 | Yin | H01L 29/66628 438/300 |
| 2016/0233333 | A1* | 8/2016 | Toh | H01L 29/7833 |

OTHER PUBLICATIONS

Q. Liu et al., Impact of Back Bias on Ultra-Thin Body and Box (UTBB) Devices, 2011 Symposium on VLSI Technology Digest of Technical Papers, Aug. 2011, IEEE.

Y. Yamamoto et al., Poly/High-k/SiON Gate Stack and Novel Profile Engineering Dedicated for Ultralow-Voltage Silicon-on-Thin-Box (SOTB) CMOS Operation, 2012 Symposium on VLSI Technology Digest of Technical Papers, Jul. 2012, IEEE.

* cited by examiner

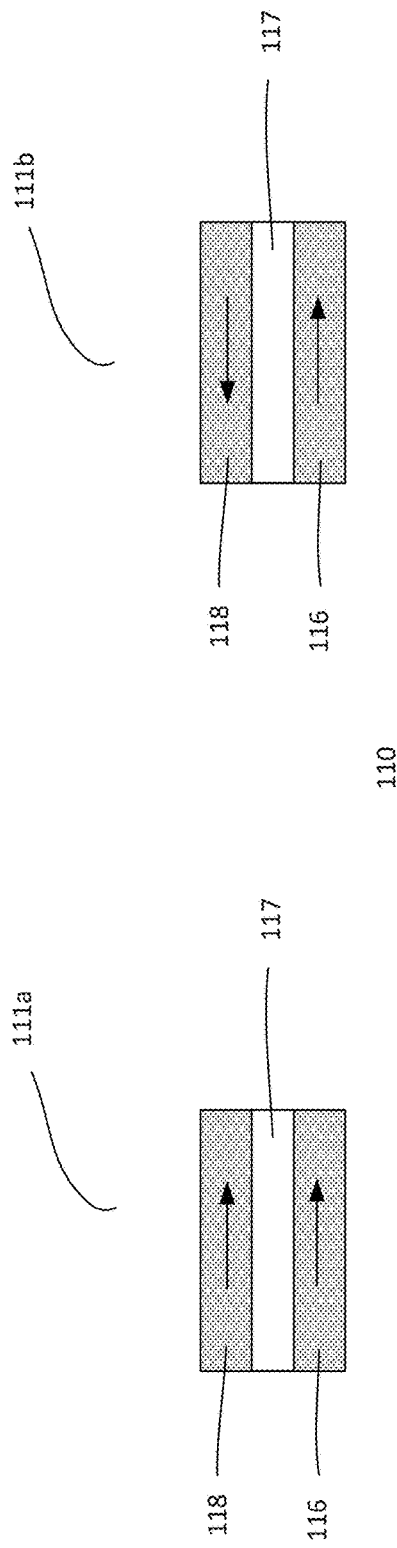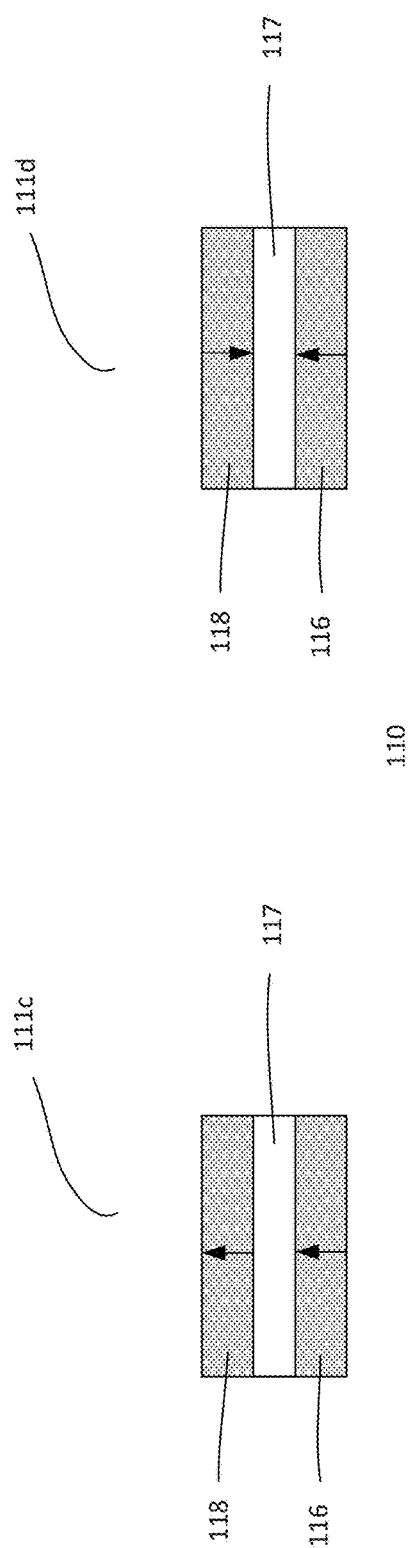

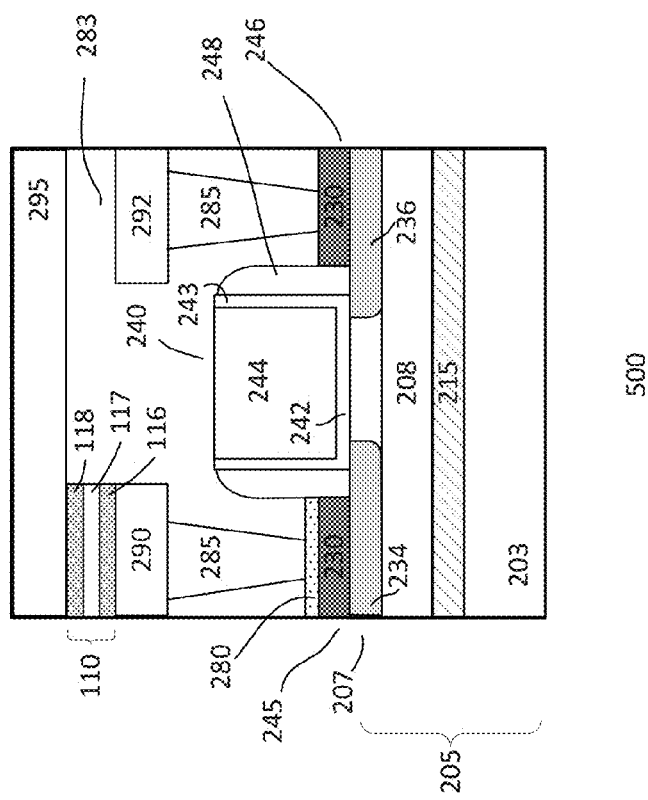
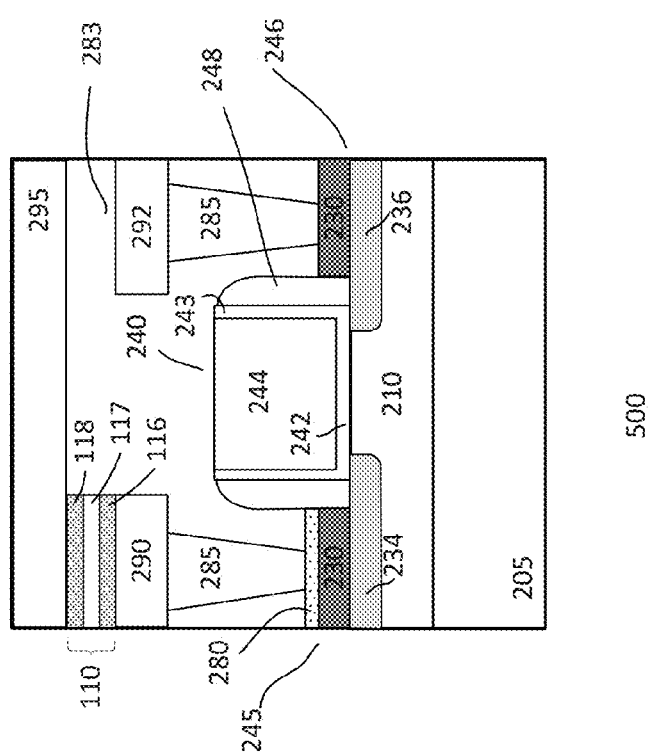
Fig. 5b
Fig. 5a

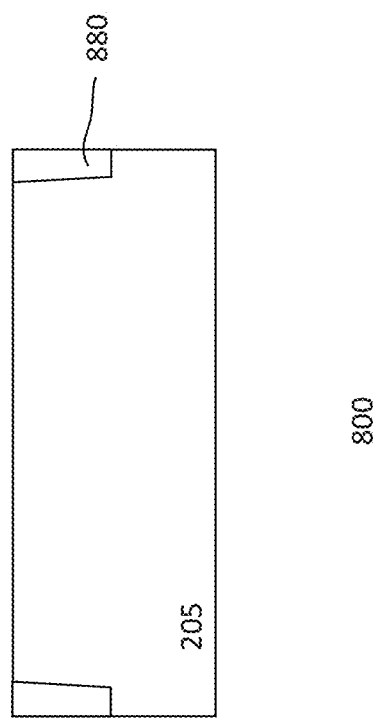

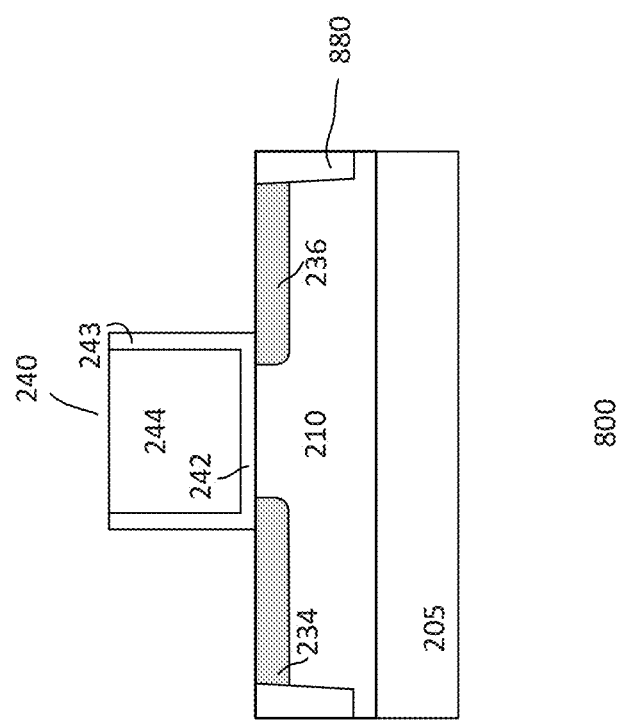

SELECTOR DEVICE FOR A NON-VOLATILE MEMORY CELL

CROSS-REFERENCE TO RELATED APPLICATION

This application claims the benefit of U.S. Provisional Application Ser. No. 62/114,598, filed on Feb. 11, 2015, which is herein incorporated by reference in its entirety for all purposes.

BACKGROUND

Magnetoresistive Random Access Memory (MRAM) is a non-volatile memory technology that has read and write response times comparable to volatile memory. MRAM typically uses a magnetic memory cell or device to store information by changing electrical resistance of a magnetic tunnel junction (MTJ) element. The resistance state changes corresponding to that of the magnetic orientation of a free layer relating to a fixed magnetic layer of the MTJ element, which may be in either a parallel (P) state or an anti-parallel (AP) state.

The write operation in MRAM cell requires a bidirectional current to achieve switching between the P and AP resistive states. The current required to switch the magnetization direction of the MTJ element between the resistive states (e.g., P to AP, or AP to P) may be different. Generally, the access transistor coupled to the MTJ element becomes source-degenerated during one of the state transitions. This may lead to a significant reduction in drive strength and adversely affect the operation of the MTJ element. During the other state transition, when the access transistor is not source-degenerated, excessive current may flow through the MRAM cell, resulting in unnecessary power consumption. This may degrade MTJ reliability due to a higher voltage drop across MTJ. Consequently, conventional MRAM cells require high write power and have poor write-ability.

From the foregoing discussion, it is desirable to provide low power magnetic memory cells with improved reliability and writing performance in memory applications.

SUMMARY

Embodiments of the present disclosure generally relate to memory devices and methods for forming a memory device. In one embodiment, a memory cell is disclosed. The memory cell includes a substrate. A select transistor on the substrate includes a gate disposed over the substrate between first and second source/drain (S/D) terminals. The first and second S/D terminals are asymmetric S/D terminals and are configured such that a resistance at the second S/D terminal is higher than a resistance at the first S/D terminal. A dielectric layer disposed over the substrate includes a plurality of inter level dielectric (ILD) layers. A lower portion of the dielectric layer includes a first contact level and a first metal level. A first contact plug disposed within the first contact level connects the first S/D terminal to a first metal line in the first metal level. A magnetic tunnel junction (MTJ) element is disposed directly on and in contact with a top of the first metal line.

In another embodiment, a method for forming a memory cell is disclosed. The method includes providing a substrate and forming a select transistor on the substrate. The select transistor includes a gate disposed over the substrate between first and second source/drain (S/D) terminals. Forming the select transistor includes forming asymmetric first and second S/D terminals such that a resistance at the second S/D terminal is higher than a resistance at the first S/D terminal. A dielectric layer is formed over the substrate. The dielectric layer includes a plurality of inter level dielectric (ILD) layers. A lower portion of the dielectric layer includes a first contact level and a first metal level. At least a first contact plug is formed within the first contact level, the first contact plug connects the first S/D terminal to a first metal line formed in the first metal level. A magnetic tunnel junction (MTJ) element is formed directly on and in contact with a top of the first metal line.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 1a-1b show diagrams of parallel state and anti-parallel state of various embodiments of a simplified MTJ element, FIG. 1c shows a schematic diagram of an embodiment of a memory cell, while

FIGS. 5a-5d show cross-sectional views of embodiments of a device;

FIG. 7b shows a cross-sectional view of the device, while

FIGS. 8a-8j show cross-sectional views of an embodiment of a process for forming a device;

DETAILED DESCRIPTION

Figure 1C:
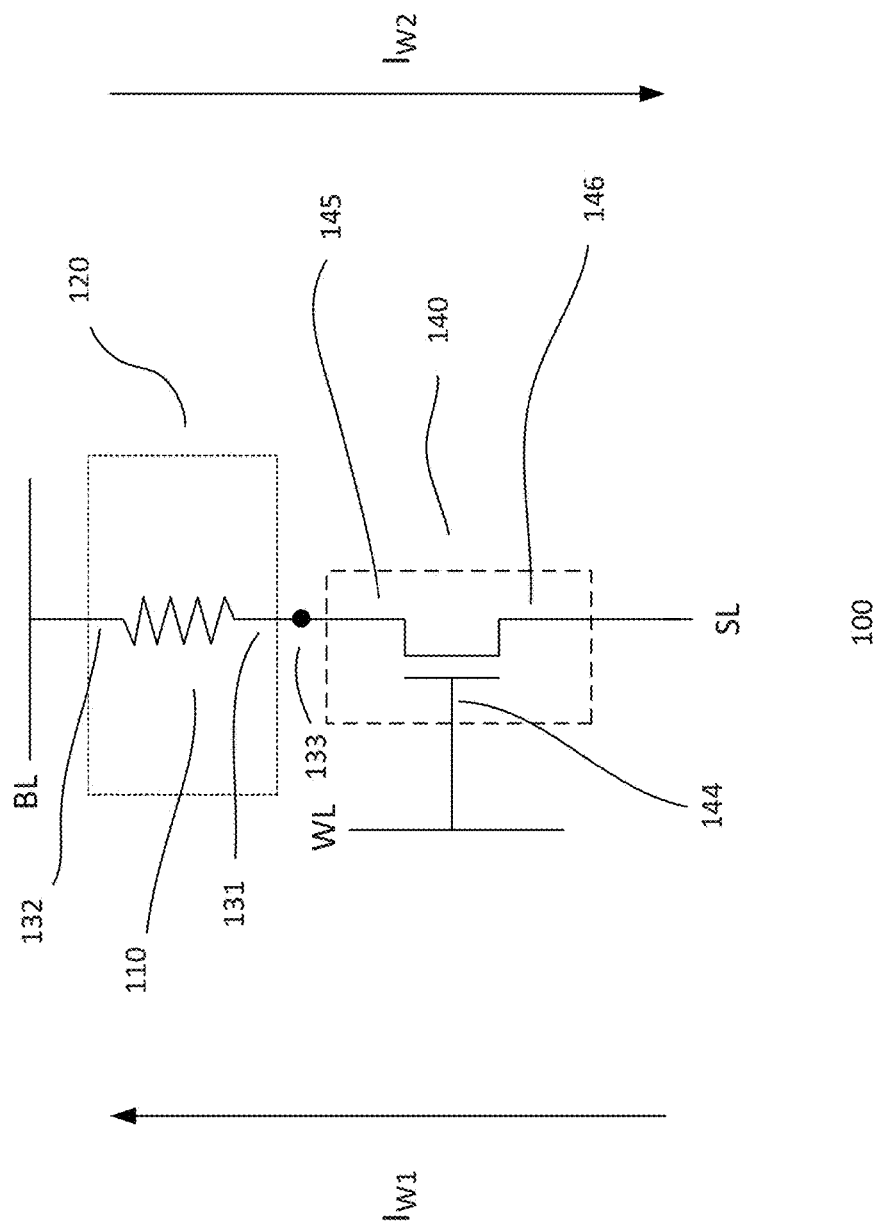

Embodiments of the present disclosure generally relate to non-volatile memory (NVM) devices. In one embodiment, the NVM devices include magnetic resistive memory cells. For example, the memory cells may be magneto-resistive random access memory (MRAM) cells. Other suitable types of memory device may also be useful. The MRAM cells, for example, may be incorporated into embedded or standalone memory devices including, but not limited to, USB or other types of portable storage units, or integrated chips (ICs), such as microcontrollers or system on chips (SoCs). The devices or ICs, may be incorporated into or used with, for example, portable consumer electronic products, or relate to other types of devices. The MRAM cells are configured to produce large write-ability at lower write power.

FIG. 1a shows a simplified cross-sectional view of an embodiment of a MTJ element 110. As shown, the magnetization or magnetic orientations of the MTJ element are configured to be in horizontal direction. Horizontal direction, for example, refers to a direction along or parallel to a substrate surface. A MTJ element includes a magnetically fixed (pinned) layer 116, a tunneling barrier layer 117 and a magnetically free layer 118. The magnetic orientation of the fixed layer is fixed while the magnetic orientation of the free layer may be programmed to be in a first or same direction as the fixed layer or in a second or opposite direction as the fixed layer. For example, as shown by the structure 11a, the magnetic direction of the free layer is programmed to be in the first or parallel (P) direction as the fixed layer. The corresponding MTJ electrical resistance between the free layer 118 and the fixed layer 116 is denoted as $R_P$. The structure 111b illustrates that the magnetization of the free layer is programmed to be in a second or anti-parallel (AP) direction as the fixed layer. The corresponding MTJ electrical resistance between the free layer 118 and the fixed layer 116 is denoted as $R_{AP}$. The resistance $R_{AP}$ is higher than the resistance $R_P$.

FIG. 1b shows magnetic orientations in the magnetic layers of a MTJ element 110 in vertical direction. Vertical direction, for example, refers to a direction perpendicular to a substrate surface. For example, the structure 111c shows that the magnetic orientations of the free and fixed layers 118 and 116 are programmed in the same vertical direction (i.e., parallel direction) with electrical resistance $R_P$, while the structure 111d illustrates that the magnetic orientations of the free and fixed layers are programmed in opposite vertical directions (i.e., anti-parallel direction) with electrical resistance $R_{AP}$.

Although the MTJ structures 111a-111d are illustrated as having a magnetically free layer positioned over a magnetically fixed layer to provide a bottom-pinned MTJ element, it is to be understood that the fixed layer 116 may also be positioned over the free layer 118 to provide a top-pinned MTJ element. For example, the fixed and free layers are interchangeable.

The illustration of the MTJ element 110 has been simplified and those skilled in the art would appreciate that a MTJ element may include additional layers to form a storage unit of a memory cell. For example, the MTJ element may include a MTJ stack having bottom and top electrodes. The bottom and top electrodes, in one embodiment, serve as the bottom and top layers of the MTJ stack. By way of example, the free and fixed layer may include CoFeB or CoFe based composite material, the tunneling barrier layer may be MgO or $Al_2O_3$, while the top and bottom electrodes may be TaN or Ta. Other suitable configurations or materials for the MTJ stack may also be useful.

FIG. 1c shows a schematic diagram of an embodiment of a memory cell or device 100. The memory cell is a NVM cell. For example, the memory cell may be a magnetoresistive memory cell. In one embodiment, the memory cell is a Spin Torque Transfer-Magnetoresistive Random Access Memory (STT-MRAM) cell. Other suitable types of memory cells may also be useful. The memory cell includes a storage unit 120 and a cell selector unit 140. The storage unit is coupled to the cell selector unit. For example, the storage unit and cell selector unit are coupled at node 133 of the memory cell. The storage unit 120, in one embodiment, includes a storage element. The storage element, for example, may be a resistive storage element. In one embodiment, the storage element includes a magnetoresistive memory element, such as a MTJ element 110. The MTJ element may be similar to that described in FIGS. 1a-1b. Other suitable types of storage element may also be useful.

The storage element includes first and second electrodes 131 and 132. The first electrode 131, for example, may be a bottom electrode while the second electrode 132 may be a top electrode. Other configurations of electrodes may also be useful. In one embodiment, the top electrode of the storage element is coupled to a bit line (BL). The bottom electrode of the storage element is coupled to the cell selector unit 140 at node 133.

The cell selector unit 140 includes a selector for selecting the memory cell. The selector, for example, may be a select transistor. In one embodiment, the select transistor is a metal oxide semiconductor (MOS) transistor. In one embodiment, the selector is a n-type MOS transistor. The select transistor includes first and second source/drain (S/D) terminals 145 and 146 and a gate or control terminal 144. The S/D terminals, for example, are formed by heavily doped regions with first polarity type dopants, defining a first type transistor. For example, in the case of a n-type transistor, the S/D terminals include n-type doped regions. Other types of transistors or selectors may also be useful.

As shown, one of the S/D terminals is coupled to the MTJ element 110 while the other S/D terminal is coupled to the source line (SL) of the memory cell. The S/D terminal coupled to the MTJ element may be referred to as a drain terminal and the terminal coupled to the SL may be referred to as a source terminal. For example, the first S/D terminal 145 may be referred to as a drain terminal and the second S/D terminal 146 may be referred to as a source terminal. As shown, the drain terminal of the select transistor is coupled to the MTJ element 110 at the node 133. For example, the drain terminal 145 is coupled to the bottom electrode 131 of the MTJ element. The source terminal 146 of the select transistor is coupled to the SL. As for the gate terminal 144, it is coupled to a wordline (WL).

Operating the memory cell 100 may include performing programming (or write) and read operations. The programmed state of the memory cell depends on the resistance state across the storage unit. During write operations, a write current flows through the select transistor and the MTJ element to switch the magnetization direction of the free layer and program the memory cell to either in a low resistance state $R_P$, or a high resistance state $R_{AP}$. The resistance states may represent logic states, such as "0" or "1". For example, a low resistance state may represent logic "0" state while a high resistance state may represent logic "1" state. Having a low resistance state representing logic "1" and a high resistance state representing logic "0" may also be useful. Other configurations of resistance states and logic states may also be useful. To initiate the write operation, a write current which exceeds a critical select current defined by the selector transistor, flows between the BL and SL in a first or second direction to write the MTJ element. The direction of the write current between the BL and SL determines the switch in magnetization of the free layer in the MTJ element. For example, a first write current ($I_{W1}$) flows in a first direction from the SL to the BL to program the MTJ element to a first resistance state and a second write current ($I_{W2}$) flows in a second direction from the BL to the SL to program the MTJ element to a second resistance state.

It is to be understood that the first and second resistance states may be $R_P$ or $R_{AP}$ depending on the configuration of the MTJ element. In one embodiment, the resistance state transition for a given write current (e.g., $I_{W1}$ or $I_{W2}$) is defined by the configuration of the free and fixed layers 118 and 116 of the MTJ element. For example, the first write current ($I_{W1}$) flowing from the SL to the BL may program a bottom-pinned MTJ element to $R_{AP}$ and the second write current ($I_{W2}$) flowing from the BL to the SL may program the bottom-pinned MTJ element to $R_P$. In another embodiment, the first write current ($I_{W1}$) may program a top-pinned MTJ element to $R_P$ and the second write current ($I_{W2}$) may program the top-pinned MTJ element to $R_{AP}$. Other configurations of the MTJ element may also define the resistance state transitions.

During read operations, a read current ($I_{read}$) is used to detect the resistance state of the MTJ element. In one embodiment, the read current flows between the BL and the SL through the select transistor and MTJ element. The read current, for example, may flow from the SL to the BL or from the BL to the SL. The resistance across the MTJ element may be determined by the potential difference between the BL and SL. For example, a higher voltage difference may represent a high resistance state and a lower voltage difference may represent a low resistance state. Alternatively, the resistance state of the MTJ element may be determined by the current strength between the BL and SL. For example, a higher $I_{read}$ value may represent a low resistance state (i.e., $R_P$) and a lower $I_{read}$ value may represent a high resistance state (i.e., $R_{AP}$). Other methods to detect the resistance state of the MTJ element may also be useful.

The first and second S/D terminals provide first and second S/D regions for current to flow through the body of a select transistor. For example, the drain terminal 145 may provide a first S/D region and the source terminal 146 may provide a second S/D region. The first S/D region may be referred to as a drain region and the second S/D region may be referred to as a source region. Other configurations of the first and second S/D terminals 145 and 146 may also be useful. The body of the transistor, for example, includes a channel coupling the first and second S/D regions for source-drain biasing. In one embodiment, the select transistor is an asymmetrical transistor which is configured to provide unequal bidirectional write currents (e.g., $I_{W1}$ and $I_{W2}$) during write operations to reduce write power and improve MTJ element performance. The select transistor is, for example, configured with asymmetrical S/D terminals to provide the memory cell with lower $I_{W2}$ than $I_{W1}$. For example, the select transistor is configured such that the electrical resistance at the source terminal 146 is higher than the electrical resistance at the drain terminal 145 as will be described in detail later.

Figure 1D:
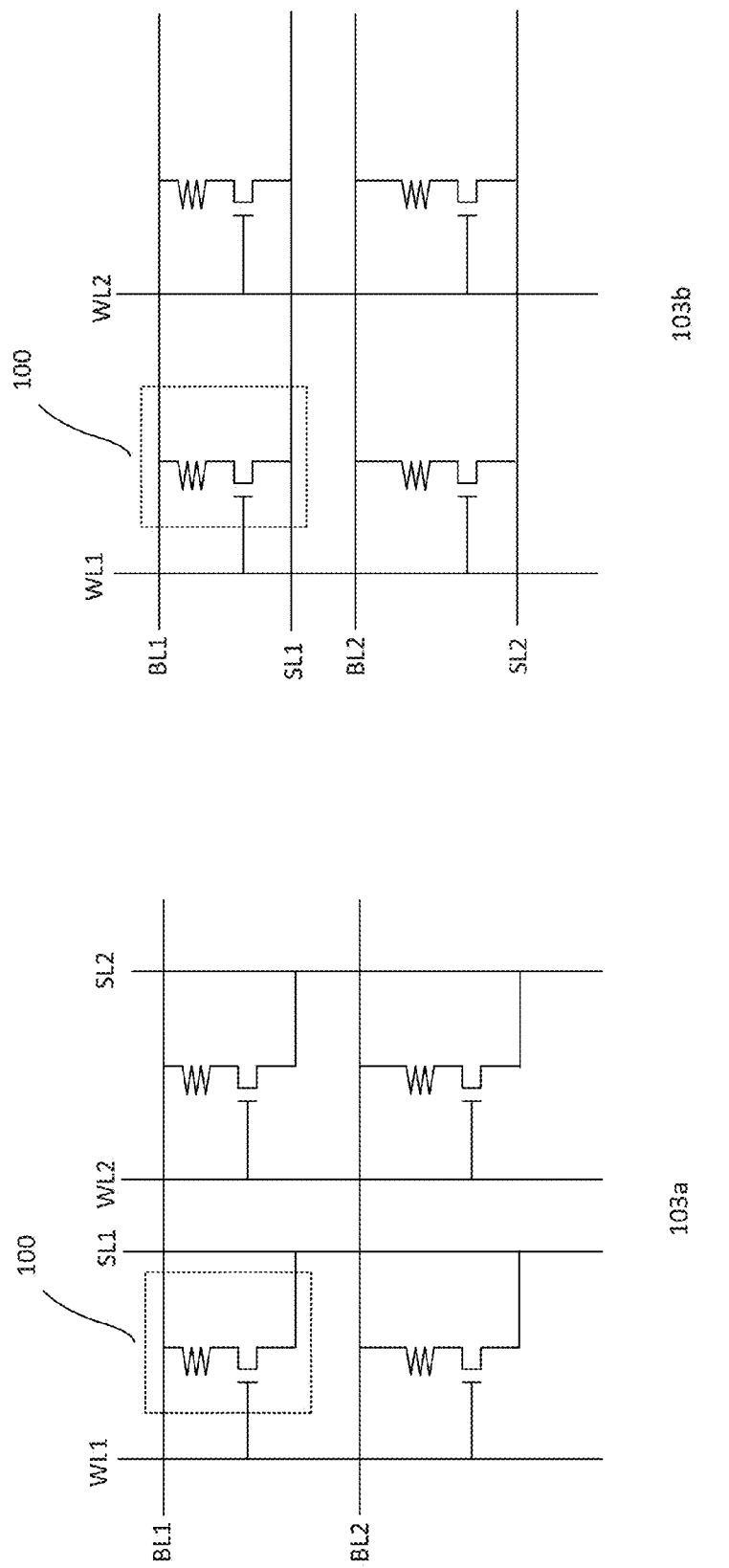
FIG. 1d shows schematic diagrams of embodiments of a memory array.

FIG. 1d shows schematic diagrams of embodiments of a memory array 103. For example, the memory array 103 may include first and second array configurations 103a and 103b. The array includes a plurality of interconnected memory cells 100. The memory cells may be similar to those described in FIG. 1c. For example, the memory cells are MRAM cells, such as STT-MRAM cells. Common elements may not be described or described in detail. Other suitable types of memory cells may also be useful.

A memory array may include four memory cells arranged in a 2×2 array. For example, the array is arranged to form two rows and two columns of memory cells. Memory cells of a row are interconnected by a BL (BL1 or BL2) while memory cells of a column are interconnected by a WL (WL1 or WL2) and SL (SL1 or SL2). The array, in one embodiment, may include WLs and SLs arranged in the column direction and BLs arranged in the row direction, as illustrated in the first array configuration 103a. For example, the array includes orthogonal SLs and BLs. Other suitable array configurations may also be useful. In another embodiment, the array may be provided with parallel SLs and BLs. For example, the array may include WLs arranged in the column direction and SLs and BLs arranged in the row direction, as illustrated in the second array 103b. A memory cell of the array may be selected by biasing the corresponding WL, BL and SL of the memory cell. For example, the storage unit of a memory cell is selected by biasing the selector unit of the memory cell with an active WL signal. Switching the resistance state of the selected storage unit is achieved by applying the appropriate voltage values to the BL and SL of the selected memory cell.

Although the array 103 is illustrated as a 2×2 array, it is understood that arrays of other sizes may also be useful.

FIGS. 2a-2d show cross-sectional views of various embodiments of a device 200. The device, as shown, includes a memory cell. The memory cell, for example, may be a NVM cell. The memory cell, in one embodiment, is a magnetoresistive NVM cell, such as a STT-MRAM cell. The memory cell, for example, is similar to that described in FIGS. 1a-1c. Common elements and features having the same reference numerals may not be described or described in detail.

The memory cell is disposed on a substrate 205. For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided. The substrate 205, in one embodiment, is a semiconductor substrate, such as a silicon substrate. For example, the substrate may be a lightly doped p-type substrate. Providing n-doped, intrinsic or other types of doped substrates, such as silicon germanium (SiGe), germanium (Ge), gallium arsenide (GaAs) or any other suitable semiconductor materials, may also be useful. P-type dopants can include boron (B), aluminum (Al), indium (In) or a combination thereof, while n-type dopants can include phosphorus (P), arsenic (As), antimony (Sb) or a combination thereof.

Figure 2B:
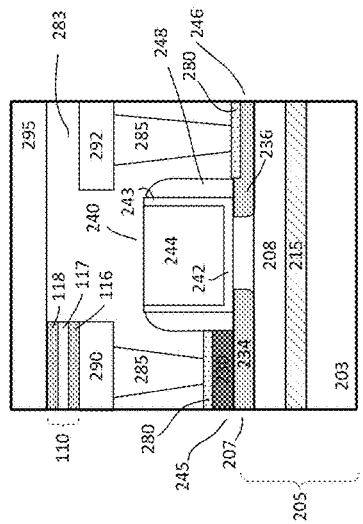
FIGS. 2a-2d show cross-sectional views of embodiments of a device.
Figure 2A:
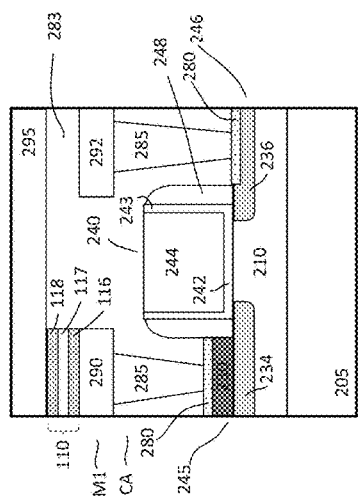
Figure 2D:
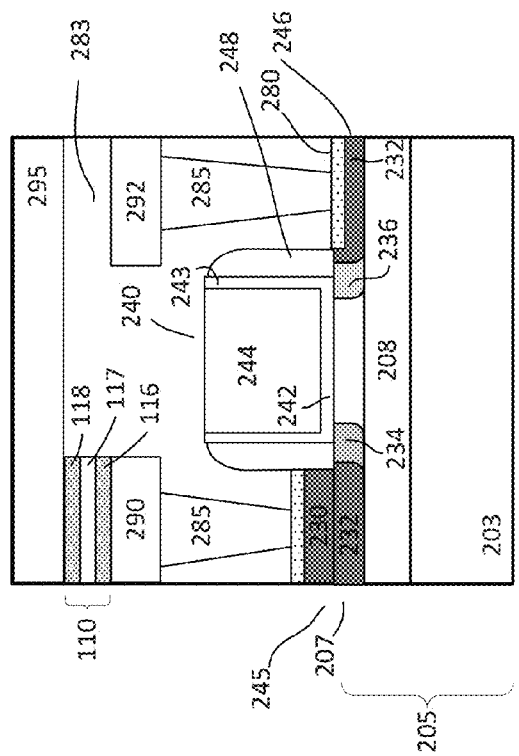
Figure 2C:
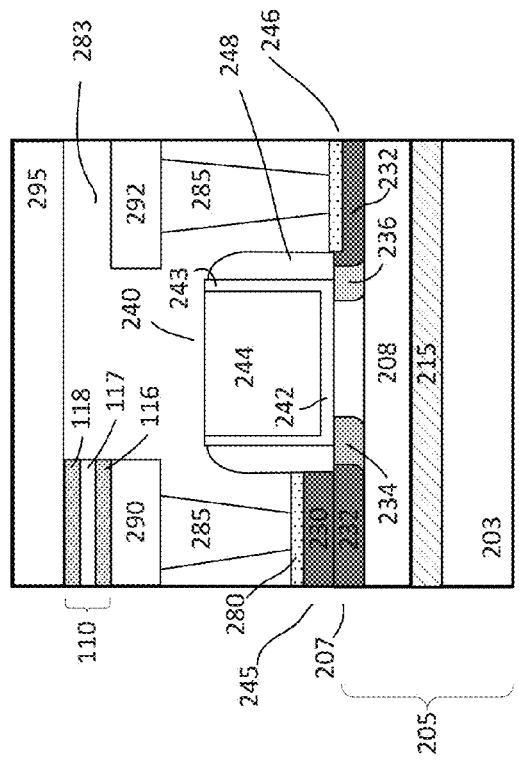

In other embodiments, the substrate 205 may be a crystalline-on-insulator (COI) substrate. As shown in FIGS. 2b-2d, a COI substrate includes a surface crystalline layer 207 separated from a bulk crystalline 203 by a buried insulator layer 208. The buried insulator layer, for example, may be silicon oxide while the surface and bulk crystalline layers are single crystalline silicon. In such case, the COI substrate is a silicon-on-insulator (SOI) substrate. Other suitable types of COI substrate may also be useful. It is understood that the surface and bulk layers need not be formed of the same material. The thickness of the surface substrate layer 207 should be sufficient to accommodate a body of the select transistor. For example, the surface substrate layer 207 may be about 0.005-0.2 µm thick. As for the thickness of the insulator layer 208, it may be about 0.01-1 µm. Other suitable thicknesses for the insulator layer and surface substrate may also be useful.

In the case of an SOI substrate, a ground plane structure may optionally be disposed below the buried insulator layer 208. The top of the ground plane structure is, for example, contiguous with the bottom of the insulator layer. As shown in FIGS. 2b-2c, the ground plane structure may be a full ground plane 215 which extends across the cell region to underlap the entire buried insulator layer 208. Other configurations of ground plane structure may also be useful. For example, the ground plane structure may also be a partial ground plane which extends across the cell region to underlap a portion of the buried insulator layer 208. Other types of ground plane structure may also be useful. The ground plane structure may include any suitable types of n-type or p-type dopants to bias the substrate. The ground plane structure, for example, serves to bias the transistor channel with positive or negative back bias. Providing a ground plane structure enables threshold voltage (Vt) adjustment and improves short channel effect. For example, in the case of a n-type transistor, a positive back bias may increase drive current and a negative back bias may decrease drive current. Depending on the purpose and requirement, the substrate may not be prepared with a ground plane, as shown in FIG. 2d.

Isolation regions (not shown) may be provided in the substrate. In one embodiment, the isolation regions are shallow trench isolation (STI) regions. Other types of isolation regions may also be useful. The isolation regions may be provided to isolate device regions from other regions. In one embodiment, isolation regions are provided to isolate memory cells from each other. Other suitable configurations of isolation regions may also be useful.

A cell selector unit is provided in the cell region. The cell selector unit includes a select transistor 240. In one embodiment, the select transistor is a metal oxide semiconductor (MOS) transistor. The MOS transistor is, for example, a n-type MOS transistor. Other types of cell selectors may also be useful.

The select transistor includes a body in the substrate within the cell region. The body, for example, includes second polarity type dopants for a first polarity type select transistor. The first polarity type may be n-type and the second polarity type may be p-type. In a silicon substrate shown in FIG. 2a, a body well 210 may be disposed in the substrate 205 and serve as the body of the select transistor. The body well may be lightly or intermediately doped with p-type dopants. For example, the body well may have a dopant concentration of about $1E15-5E18/cm^3$. Other suitable dopant concentrations may also be useful. Alternatively, in an SOI substrate shown in FIGS. 2b-2d, the surface substrate 207 serves as the body of the select transistor. The surface substrate may be similarly doped as the body well. Providing a surface substrate having other dopant concentrations may also be useful. For example, an intrinsically doped surface substrate may also serve as the body of the select transistor.

The select transistor, in one embodiment, includes first and second S/D terminals 245 and 246 and a gate disposed on the substrate between the S/D terminals. In one embodiment, the first and second S/D terminals 245 and 246 correspond to the first and second S/D terminals 145 and 146 while the gate corresponds to the gate terminal 144 as described in FIG. 1c. The gate, as shown, includes a gate electrode 244 and a gate dielectric 242. The gate dielectric 242, for example, is disposed below the gate electrode 244 and separates the gate electrode from the substrate 205. The gate electrode may be polysilicon while the gate dielectric may be silicon oxide. Other suitable types of gate electrodes and gate dielectrics may also be useful. For example, the gate may include a metal gate electrode. A metal gate electrode may be TaN, TiN, etc. As for the gate dielectric, it may be a high-k gate dielectric. For example, the gate dielectric layer may be $HfO_2$, HfSiON, $La_2O_3$, zirconium oxide or silicates thereof. The gate, in one embodiment, may be a gate conductor along a first or WL direction. The gate conductor, for example, forms a common gate for a column of memory cells.

Gate sidewall spacers 248 may be disposed on the sidewalls of the gate. The sidewall spacers, for example, may be silicon nitride. Other suitable types of dielectric materials may also be used. For example, the spacers may be silicon nitride or multiple layers of dielectric materials, such as silicon oxide and silicon nitride. In one embodiment, dielectric liners 243 are provided between gate and the sidewall spacers 248. The dielectric liners 243 are, for example, oxide liners lining the sidewalls of the gate electrode 244 and gate dielectric 242. For example, the oxide liners 243 extend to the top surface of the substrate 205. The sidewall spacers and dielectric liners, for example, are used to prevent shorts between the gate and heavily doped S/D regions of the first and second S/D terminals 245 and 246.

The S/D terminals 245 and 246 include first polarity type doped regions for a first polarity type select transistor. For example, the S/D terminals include n-type doped regions for a n-type transistor. In one embodiment, the first S/D (or drain) terminal 245 is electrically connected to the MTJ element 110, which is coupled to the BL, and the second S/D (or source) terminal 246 is electrically connected to the SL. For example, the drain terminal 245 is coupled to the BL and the source terminal 246 is coupled to the SL.

The first and second S/D terminals may include heavily doped first and second S/D regions. For example, the source terminal 246 may include a heavily doped source region and the drain terminal 245 may include a heavily doped drain region. A S/D region, for example, may have a dopant concentration of about $1E19-1E21/cm^3$. Other suitable dopant concentration may also be useful. A S/D region, for example, may include a base portion and/or a raised portion. A base S/D portion 232 is, for example, a heavily doped portion disposed in the substrate within the body of the transistor while a raised S/D portion 230 is disposed on the substrate. The raised S/D portion 230, in one embodiment, is a heavily doped epitaxial layer disposed on the top substrate surface. The raised S/D portion may abut the gate spacer 248. The raised S/D portion, for example, includes a thickness lower than a height of the gate. For example, the thickness of a raised S/D portion may be about 10-100 nm. Other suitable thickness ranges may also be useful.

A S/D terminal, in some embodiments, may be provided with first and second S/D extension regions. The S/D extension regions may be lightly doped first and second diffusion (LDD) regions 234 and 236 disposed in the substrate. The LDD regions include first polarity type dopants for first polarity type transistor. The LDD regions, for example, have a dopant concentration of about $1E18-5E19/cm^3$. Other dopant concentrations may also be useful. In one embodiment, the LDD regions extend beyond the heavily doped S/D regions to underlap the transistor gate. The LDD regions, for example, extend slightly under the gate. The LDD regions serve to connect the channel to the S/D terminals of the transistor.

The LDD regions and base portions of the heavily doped S/D regions may include a depth from the top substrate surface. In one embodiment, the LDD regions and base S/D portions include the same depth. In the case where the body of the transistor is a surface substrate of an SOI substrate, the LDD regions and base portions of the heavily doped S/D regions may extend from the top substrate surface to the top of the buried insulator layer 208. For example, the top of the buried insulator layer 208 is contiguous with the bottom of the LDD regions 234 and 236 and the base S/D portions 232. Other depth configurations of the LDD regions and base S/D portions may also be useful, depending on design requirements or technology node. For example, the LDD region and base S/D portion may include different depths. In the case where the LDD regions and base S/D portions include different depths, the LDD regions may have a depth shallower than the base S/D portions.

The select transistor 240, in one embodiment, is provided with asymmetrical configurations of source and drain terminals 246 and 245. For example, the S/D terminals include different configurations of S/D regions. In one embodiment, the S/D terminals include asymmetrical S/D regions that are configured such that the resistance in the source terminal 246 is high while the resistance in the drain terminal 245 is low. In one embodiment, the drain terminal 245 includes a raised S/D portion 230 while the source terminal 246 is devoid of a raised S/D portion as shown in FIGS. 2a-2d. Thus, the select transistor includes a one-sided raised S/D region. The select transistor with the one-sided raised S/D region, for example, may include various suitable configurations. For example, in some cases, the first and second S/D regions may be devoid of base S/D portions as shown in FIGS. 2a-2b. In such case, the source terminal 246 includes a LDD region 236 without a heavily doped source region as shown. In some other cases, the first and second S/D regions may be provided with base S/D portions 232 as shown in FIGS. 2c-2d. Other configurations of asymmetrical source and drain terminals may also be useful.

Metal silicide contacts 280 may be provided on the contact regions of the select transistor. For example, the metal silicide contacts may be disposed on the first and second S/D regions and the transistor gate (not shown). The metal silicide contacts, for example, may be nickel or nickel-based metal silicide contacts. Other suitable types of metal silicide contacts, including cobalt or cobalt-based metal silicide contacts may also be useful. The silicide contacts may be about 50-500 Å thick. Other thicknesses may also be useful. Other configurations of metal silicide contacts may also be useful. The metal silicide contacts may be employed to reduce contact resistance to contact plugs.

As discussed, the first and second S/D terminals 245 and 246 may include asymmetrical configurations of S/D regions. In one embodiment, metal silicide contacts are provided on the asymmetrical S/D regions. For example, the metal silicide contacts are disposed on the raised S/D portion 230 of the drain terminal 245 and on the base S/D portion 232 of the source terminal 246, as shown in FIGS. 2c-2d. Alternatively, in the case where S/D regions are not provided with base S/D portions, the metal silicide contacts may be disposed on the raised S/D portion 230 of the drain terminal 245 and on the LDD region 236 of the source terminal 246, as shown in FIGS. 2a-2b.

A dielectric layer 283 is disposed over the substrate. For example, the dielectric layer is an interlevel dielectric (ILD) layer. An ILD layer includes metal levels and contact levels. Generally, a metal level includes conductive or metal lines while the contact level includes contacts plugs. Contact plugs provide vertical connections to metal lines in higher metal levels. It is understood that there may be additional layers between the dielectric layer and the substrate, such as an etch stop layer. The ILD layer includes upper and lower portions. The upper portion serves as an intra-metal dielectric (IMD) layer which includes metal levels and contact levels. The lower portion serves as a pre-metal dielectric (PMD) layer (or first contact level) in which contact plugs are formed to provide connections between contact regions on the substrate and the metal levels in the IMD layer. The dielectric layer may be, for example, silicon oxide. Other types of dielectric layers which may serve as the ILD layer may also be used.

The conductive lines and contact plugs may be formed of a metal, such as copper, copper alloy, aluminum, tungsten or a combination thereof. Other suitable types of metal, alloys or conductive materials may also be useful. In some cases, the conductive lines (or conductors) and contact plugs (or contacts) may be formed by dual damascene processes. This results in the conductors and contacts having the same material. In other cases, the conductors and contacts may be formed by single damascene processes, which results in conductors and contacts having different materials. For example, the conductive lines may include aluminum or copper materials while the contact plugs may include tungsten material. Other techniques, such as reactive ion etch (RIE) may also be employed to form metal lines.

A device may include a plurality of dielectric layers to form different ILD levels. For example, x number of ILD levels may be provided. The number of ILD levels may depend on, for example, design requirements or the logic process involved. As illustrated, the dielectric layer 283 includes a dielectric stack having multiple dielectric layers over a first contact level. Metal lines of a metal level may form interconnect lines. Interconnect lines provide interconnections between the various components of the IC to perform the desired functions. Alternatively, the metal lines may form interconnect pads. The interconnect pads provide connections to upper ILD levels. In one embodiment, metal lines extending along a column or WL direction are formed in a lower metal level and metal lines extending along a row or BL direction are formed in an upper metal level. The metal lines may be the conductive lines of the memory array 103. For example, interconnect lines disposed in different metal levels may form the SL, BL and WL of the memory array 103. Interconnect lines designated as the SL, BL and WL may be electrically connected to corresponding SL, BL and WL drivers which provide active signals for read and write operations.

As described, contact plugs or via plugs 285 may be disposed in the PMD layer. The contact plugs are in communication with the terminals or contact regions of the select transistor. In one embodiment, the contact plugs directly connect the first and second S/D terminals of the select transistor to metal lines disposed in a lower metal level, such as a first metal level M1. In one embodiment, the source terminal 246 is connected to an interconnect line 292 in M1 and the drain terminal 245 is connected to an interconnect pad 290 in M1. The interconnect line 292, for example, extends along a column (or WL) direction and serves as a SL.

The storage unit of the memory cell may be disposed between the upper metal levels of the ILD layer and M1. For example, the storage unit is disposed on the interconnect pad 290 connected to the drain terminal 245. The storage unit includes a storage stack having various layers. The storage stack may be a magnetic storage stack. The magnetic storage stack is, for example, a MTJ element 110, similar to that described in FIGS. 1a-1b. Common elements may not be described or described in detail. For example, the MTJ element may include various layers configured as a top-pinned or bottom pinned magnetic memory stack. In one embodiment, the MTJ element is configured as a bottom pinned magnetic memory stack. For example, the magnetically fixed layer 116 is positioned below the magnetically free layer 118.

The MTJ element, for example, includes an MTJ stack disposed between top and bottom electrodes (not shown). The bottom electrode is, for example, disposed on top of the interconnect pad 290. The interconnect pad 290 provides connection from the MTJ element to the drain terminal 245 of the select transistor. As for the top electrode, it is coupled to an interconnect line 295 disposed in an upper metal level of the ILD layer. The interconnect line 295, for example, extends along the row (or BL) direction and serves as a BL. The BL is, in one embodiment, disposed in an upper metal level directly over the MTJ element. In other embodiments, the BL may be disposed in other upper metal levels.

Although the BL and SL are illustrated as interconnect lines disposed in different metal levels (i.e., 295 and 292), it is understood that interconnect lines disposed in the same metal level may also serve as the BL and SL. For example, the BL and SL may be disposed in the same upper metal level of the ILD layer to form parallel BL and SL. In such case, multiple interconnect pads and contact plugs may connect the source terminal 246 to the SL.

The embodiments as described in FIGS. 2*a*-2*d* result in various advantages. For example, the asymmetrical configurations of the transistor S/D regions provide a lower resistance at the drain terminal 245 and a higher resistance at the source terminal 246. This configuration leads to unequal bidirectional write currents where $I_{W2}$ is lower than $I_{W1}$. As a result, switching the MTJ between first and second resistance states produces less excess write current and improves MTJ reliability. The higher resistance at the source terminal 246 also improves short channel effects and reduces leakage current. In addition, this configuration reduces the read current ($I_{Read}$), leading to an improved read disturb margin (RDM) of the memory cell. Moreover, the process for forming the memory cell, which will be described in detail later, is highly compatible with logic processing or technology. This avoids the investment of new tools and new processing module, thereby providing a cost effective solution.

Figure 3B:
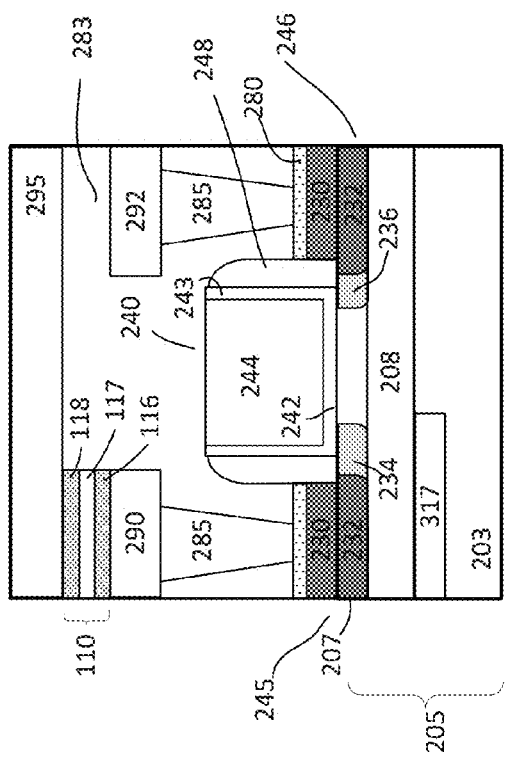
FIGS. 3a-3b show cross-sectional views of embodiments of a device.
Figure 3A:
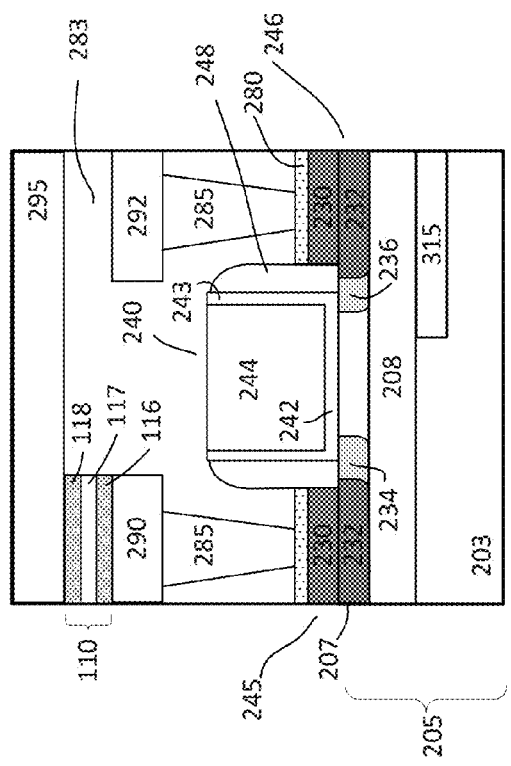

FIGS. 3*a*-3*b* show cross-sectional views of various embodiments of a device 300. The device 300, as shown, includes a memory cell. The memory cell, for example, is similar to that described in FIGS. 1*a*-1*c* and FIGS. 2*a*-2*d*. Common elements and features having the same reference numerals may not be described or described in detail. In the interest of brevity, the description of the device below primarily focuses on the difference(s) compared with the device 200 shown in FIGS. 2*a*-2*d*.

The memory cell is disposed on a substrate 205. As shown, the substrate 205 is an SOI substrate. The device 300 differs from the device 200 shown in FIGS. 2*a*-2*d* in that the device 300 includes first and second S/D terminals 245 and 246 having LDD regions 234 and 236 and heavily doped S/D regions. In one embodiment, the S/D regions include heavily doped raised and base S/D portions 230 and 232. For example, heavily doped epitaxial layers disposed on the top substrate surface form the raised S/D portions. The raised S/D portions may abut the gate spacers 248. The base S/D portions are, for example, heavily doped portions disposed in the substrate within the body of the select transistor.

The select transistor 240, in one embodiment, is provided with asymmetrical configurations of first and second S/D terminals 245 and 246. In one embodiment, the select transistor is configured such that the resistance in the drain terminal 245 is low while the resistance in the source terminal 246 is high. In one embodiment, a partial ground plane structure, which forms a local ground plane (LGP), is provided below the buried insulator layer 208 and within the bulk substrate 203 of the SOI substrate. The LGP is positioned below the first S/D terminal 245 or second S/D terminal 246 to provide different threshold voltage (Vt) adjustments which affect the resistance of the S/D terminals of the select transistor. Thus, the select transistor includes a one-sided LGP 315 or 317. The LGP, for example, extends beyond the LDD region 234 or 236 to underlap a portion of the gate. The LGP, for example, extends sufficiently beyond the LDD region 234 or 236 to provide a suitable back bias. Other configurations of ground plane structure may also be useful. The LGP may include any suitable types of n-type or p-type dopants to bias the substrate. The LGP biases the transistor channel with positive or negative back bias. In one embodiment, the LGP 315 is positioned below the second S/D terminal 246. In such case, the substrate is devoid of a ground plane structure below the first S/D terminal 245. The LGP 315 includes p-type dopants and is provided with a negative back bias such that the Vt is increased which leads to higher resistance at the source terminal 246, as shown in FIG. 3*a*. In another embodiment, the LGP 317 is positioned below the first S/D terminal 245, as shown in FIG. 3*b*. In such case, the substrate is devoid of a ground plane structure below the second S/D terminal 246. The LGP 317 includes n-type dopants and is provided with a positive back bias such that the Vt is decreased which leads to lower resistance at the drain terminal 245.

The embodiments as described in FIGS. 3*a*-3*b* result in various advantages. For example, by providing a one-sided LGP below the source or drain terminal, different Vt adjustment is achieved, leading to unequal bidirectional write currents $I_{W1}$ and $I_{W2}$. In the case where the p-type LGP 315 is provided, the Vt at the source terminal 246 is increased such that $I_{W2}$ is decreased. In the case where the n-type LGP 317 is provided, the Vt at the drain terminal 245 is decreased such that $I_{W1}$ is increased. This advantageously results in unequal bidirectional write currents where $I_{W2}$ is lower than $I_{W1}$. In addition, higher Vt at the source terminal also provides for improved RDM of the memory cell. Moreover, the process for forming the memory cell, which will be described in detail later, is highly compatible with logic processing or technology.

Figure 4A:
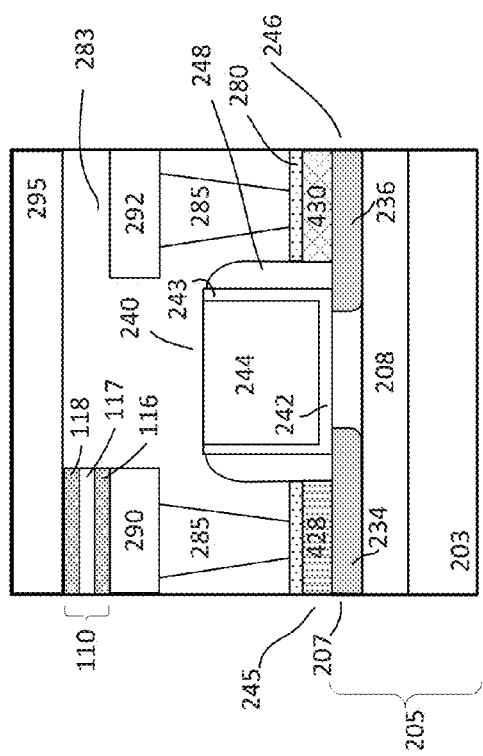
FIGS. 4a-4b show cross-sectional views of embodiments of a device.
Figure 4B:
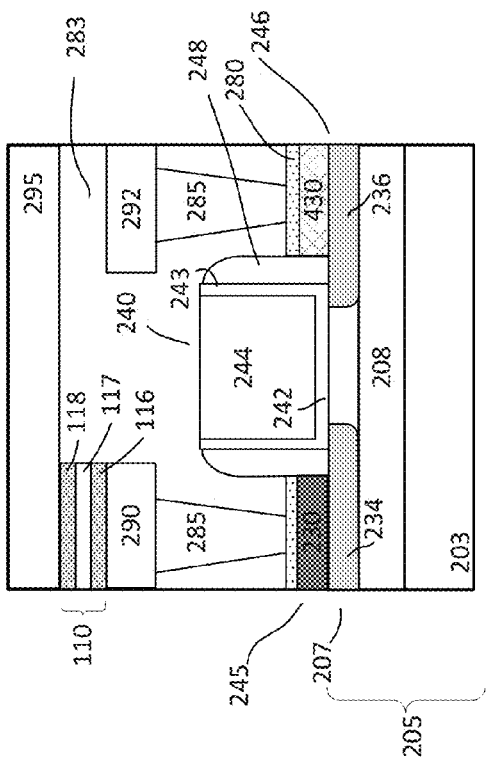

FIGS. 4*a*-4*b* show cross-sectional views of various embodiments of a device 400. The device 400, as shown, includes a memory cell. The memory cell, for example, is similar to that described in FIGS. 1*a*-1*c*, FIGS. 2*a*-2*d* and FIGS. 3*a*-3*b*. Common elements and features having the same reference numerals may not be described or described in detail. In the interest of brevity, the description of the device below primarily focuses on the difference(s) compared with the device 300 shown in FIGS. 3*a*-3*b*.

The memory cell is disposed on a substrate 205. As shown, the substrate 205 is an SOI substrate. The SOI substrate may be devoid of a LGP structure in the bulk substrate 203. Although the embodiments illustrate an SOI substrate, it is to be understood that the substrate 205 may also be a silicon substrate, such as that described in FIG. 2*a*.

The select transistor 240 of the device 400 includes asymmetrical configurations of S/D terminals. The device 400 differs from the device 300 shown in FIGS. 3*a*-3*b* in that the S/D terminals are configured with different types of S/D regions. In some embodiments, the first and second S/D terminals 245 and 246 include raised S/D portions without base S/D portions.

In one embodiment, the S/D terminals may be configured with stress-inducing materials. For example, a S/D terminal may include S/D stressors disposed in the raised S/D portion. S/D stressors include a stressor material to induce a compressive or tensile strain upon the LDD regions and the channel of the transistor. To cause a strain, the stressor material should have a crystal lattice which is larger or smaller than the crystal lattice of the substrate. The strain may either be biaxial, uniaxial or a combination thereof. For example, the S/D stressors may produce a uniaxial strain on the top surface of the substrate. Other configurations of strain may also be useful. The S/D stressors include, for example, Si, Ge, SiGe, SiGe:C, SiGeSn, GeSn, Si:C, GaAs, or a combination thereof. Other types of stressor materials may also be useful. The material selected may depend on, for example, the desired strain on the channel and the material of the channel.

In one embodiment, the first and second S/D terminals 245 and 246 may be asymmetrically doped with stressor materials. For example, the raised S/D portion 430 of the second S/D terminal 246 may be doped with stressor material while the raised S/D portion 230 of the first S/D terminal 245 is devoid of stressor material, as shown in FIG. 4a. In one embodiment, the second S/D terminal 246 includes a compressive strain inducing stressor material. For example, the raised S/D portion 430 includes SiGe material and the raised S/D portion 230 includes Si material. The compressive strain inducing stressor material in the raised S/D portion 430 increases resistance across the source terminal 246. In such case, the resistance across the drain terminal 245 is, for example, lower than the second S/D terminal 246. Other configurations of S/D regions may also be useful to provide S/D terminals with unequal resistance. For example, the raised S/D portion 230 may be asymmetrically doped with tensile strain inducing stressor material (e.g., Si:C) while the raised S/D portion 430 is devoid of stressor material (e.g., Si). In this case, the tensile strain in the raised S/D portion 230 decreases resistance across the drain terminal 245 such that the resistance across the drain terminal 245 is lower than the source terminal 246.

In another embodiment, the first and second S/D terminals 245 and 246 may include different types of stressor materials as shown in FIG. 4b. As shown, the raised S/D portion 428 of the first S/D terminal 245 may include a tensile strain inducing stressor material (e.g., Si:C) while the raised S/D portion 430 of the second S/D terminal 246 may include a compressive strain inducing stressor material (e.g., SiGe). Other suitable configurations of stressor materials may also be useful. The compressive strain inducing stressor increases resistance across the source terminal 246 while the tensile strain inducing stressor reduces resistance across the drain terminal 245. This provides S/D terminals with unequal resistance.

The embodiments as described in FIGS. 4a-4b result in various advantages similar to that of FIGS. 2a-2d. For example, the asymmetrical configurations of the S/D terminals provides a lower resistance at the drain terminal 245 relative to the source terminal 246. This leads to unequal bidirectional write currents where $I_{W2}$ is lower than $I_{W1}$, thereby reducing excess write currents and power consumption. In addition, this configuration improves RDM of the memory cell and is highly compatible with logic processes.

FIGS. 5a-5d show cross-sectional views of various embodiments of a device 500. The device 500, as shown, includes a memory cell. The memory cell, for example, is similar to that described in FIGS. 1a-1c, FIGS. 2a-2d, FIGS. 3a-3b and FIGS. 4a-4b. Common elements and features having the same reference numerals may not be described or described in detail. In the interest of brevity, the description of the device below primarily focuses on the difference(s) compared with the device 300 shown in FIGS. 3a-3b.

The memory cell is disposed on a substrate 205. The substrate 205 may be provided with an SOI substrate or a silicon substrate having a p-type body well.

The select transistor 240, in one embodiment, is provided with asymmetrical configurations of first and second S/D terminals 245 and 246. In one embodiment, the select transistor is configured such that the resistance in the source terminals 246 is high while the resistance in the drain terminal 245 is low. The device 500 differs from the device 300 as shown in FIGS. 3a-3b in that the device 500 includes asymmetrical configurations of metal silicide contacts at S/D regions of the first and second S/D terminals 245 and 246. In one embodiment, metal silicide contacts 280 are disposed on the contact regions of the select transistor, including the first S/D terminal 245 while metal silicide contact is not formed on the second S/D terminal 246. For example, a contact plug 285 directly contacts the metal silicide contact 280 disposed on the raised S/D portion 230 at the first S/D terminal 245 while another contact plug 285 directly contacts the raised S/D portion 230 at the second S/D terminal 246. As shown in FIGS. 5a-5b, the second S/D terminal 246 is not provided with a metal silicide contact to increased contact resistance at the S/D region of the second S/D terminal 246. For example, a metal silicide contact provides an ohmic contact and reduces contact resistance between the contact plug 285 and the S/D region of the first S/D terminal 245.

Figure 5D:
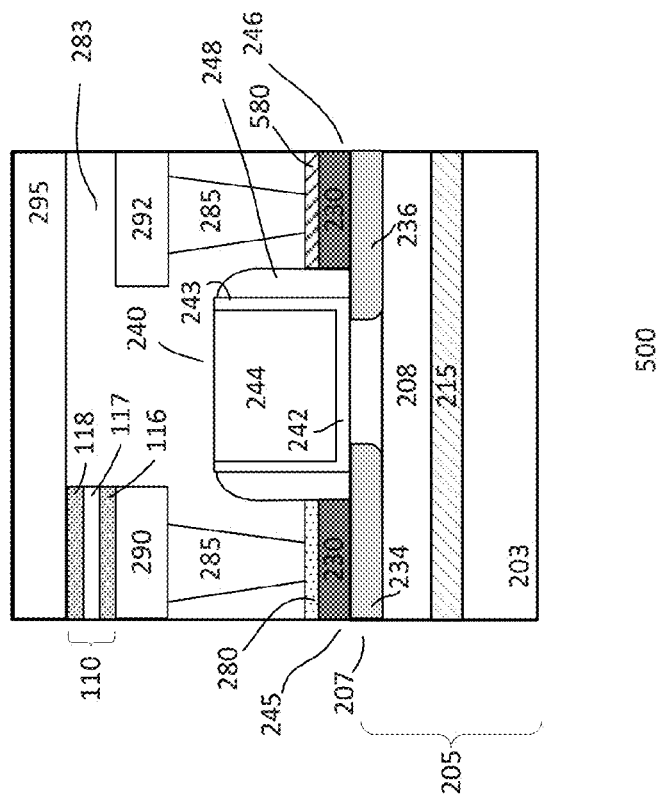
Figure 5C:
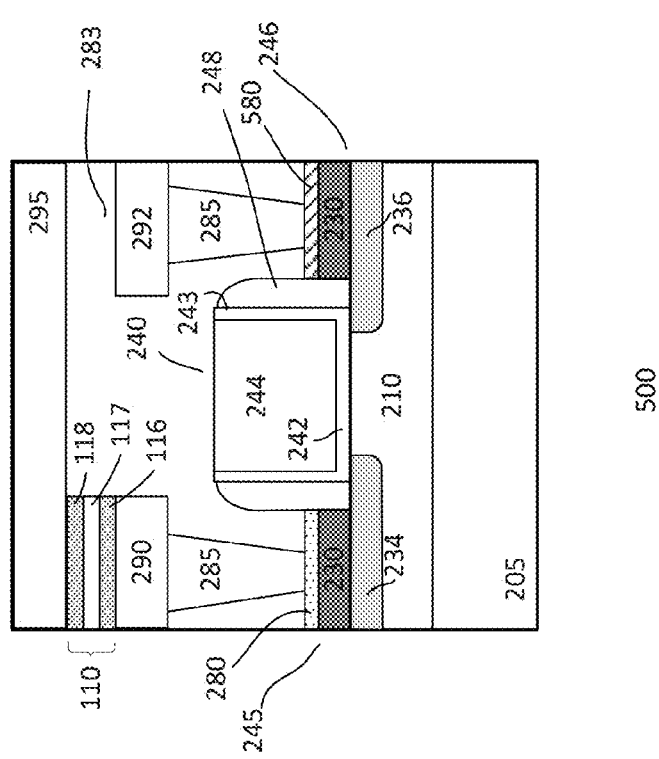

Alternatively, to increase contact resistance at the second S/D terminal 246, the raised S/D portion 230 of the second S/D terminal 246 may be provided with a metal silicide contact 580 having a higher contact resistivity than the metal silicide contact 280 of the first S/D terminal 245. The interface of a metal silicide contact and a semiconductor material includes a Schottky barrier (SB) region having a Schottky barrier height (SBH). In one embodiment, the value of the SBH is dependent on the type of metal silicide and semiconductor material of the S/D region. For example, different types of metal silicide with different polarity type S/D regions increase or decrease the SBH. A higher SBH provides a higher contact resistance. As shown in FIGS. 5c-5d, the metal silicide contact 580 of the second S/D terminal 246 provides a higher SBH than the metal silicide contact 280 of the first S/D terminal 245. For example, in the case where the raised S/D portions 230 include n-type dopants for a n-type transistor, the first S/D terminal 245 may include a nickel (Ni) silicide contact 280 and the second S/D terminal 246 may include a platinum (Pt) silicide contact 580. This increases the contact resistance across the second S/D terminal 246 and decreases the contact resistance across the first S/D terminal 245. Other suitable types and configurations of metal silicides 280 and 580 may also be useful. For example, Erbium (Er) silicide contact may also be provided to increase the contact resistance of n-type S/D regions. Providing suitable configurations of metal silicides 280 and 580 for p-type raised S/D portions may also be useful.

In another embodiment, the S/D regions of the first and second S/D terminals 245 and 246 may be provided with the same type of metal silicide contacts. For example, Ni silicide contacts are disposed on the raised S/D portions 230 of the S/D terminals. In one embodiment, the raised S/D portion of the first S/D terminal 245 includes acceptor-like or donor-like dopants to modulate SBH, while the raised S/D portion of the second S/D terminal 246 is devoid of dopants to modulate SBH. For example, the Ni silicide contact 280 of the first S/D terminal 245 is a dopant-segregated Ni silicide contact. In the case of a n-type raised S/D portion, donor-like dopants, such as aluminum (Al) or Antimony (Sb) may be provided to decrease the SBH of the dopant-segregated Ni silicide contact. This provides the drain terminal 245 with a lower contact resistance than the source terminal 246. Other configurations of the metal silicide contacts 280 and 580 may also be useful. For example, acceptor-like or donor-like dopants may also be provided to increase the SBH of the Ni silicide contact 580 for a high resistance source terminal 246 and low resistance drain terminal 245.

The embodiments as described in FIGS. 5a-5d result in various advantages similar to that of FIGS. 2a-2d and FIGS. 4a-4b and the advantages will not be described or repeated herein.

Figure 6B:
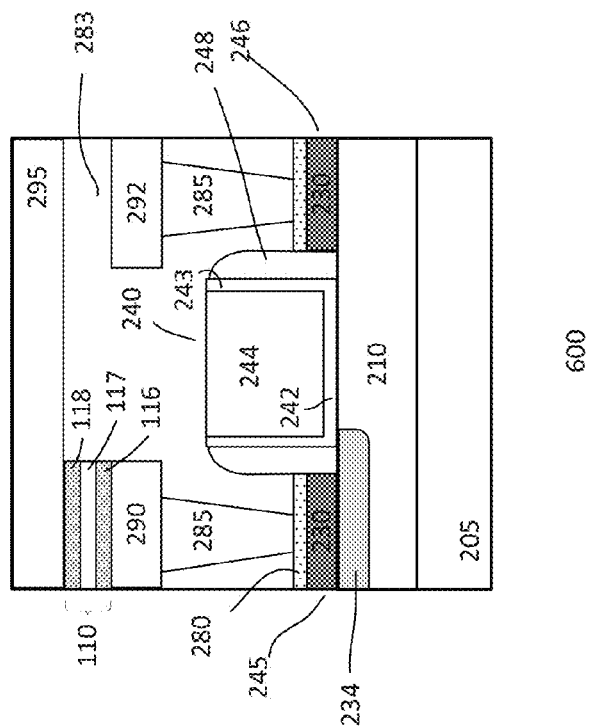
FIGS. 6a-6b show cross-sectional views of embodiments of a device.
Figure 6A:
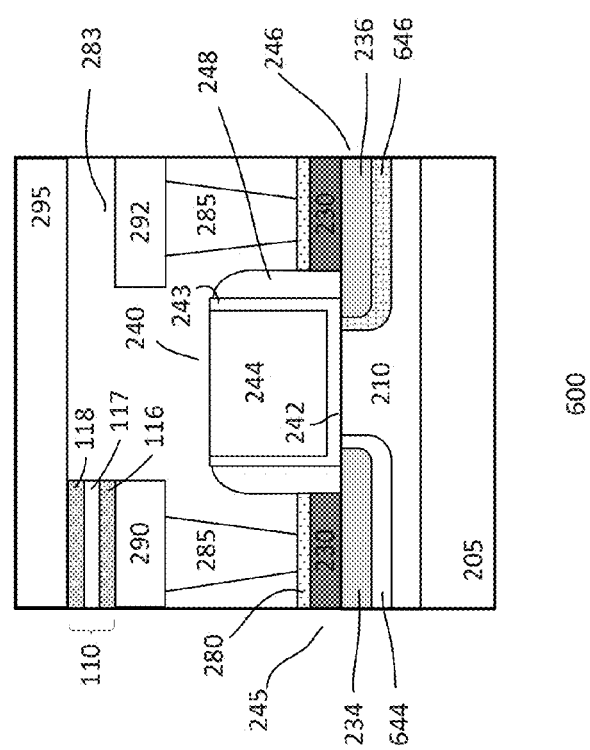

FIGS. 6a-6b show cross-sectional views of various embodiments of a device 600. The device 600, as shown, includes a memory cell. The memory cell, for example, is similar to that described in FIGS. 1a-1c, FIGS. 2a-2d, FIGS. 3a-3b, FIGS. 4a-4b and FIGS. 5a-5d. Common elements and features having the same reference numerals may not be described or described in detail. In the interest of brevity, the description of the device below primarily focuses on the difference(s) compared with the device 300 shown in FIGS. 3a-3b.

The memory cell is disposed on a substrate 205. The substrate 205, in one embodiment, includes a silicon substrate having a body well 210 similar to that shown in FIG. 2a.

The select transistor 240, in one embodiment, is provided with asymmetrical configurations of first and second S/D terminals. In one embodiment, the select transistor is configured such that the resistance at the second S/D terminal 246 is high while the resistance at the first S/D terminal 245 is low. The device 600 differs from the device 300 shown in FIGS. 3a-3b in that the S/D terminals of the device includes asymmetrical Vt which provides for asymmetrical resistance at the first and second S/D terminals 245 and 246 of the select transistor 240. In one embodiment, the S/D terminals include raised S/D portions 230 and LDD regions 234 and 236. In one embodiment, the S/D terminals include first and second halo regions 644 and 646 disposed in the substrate within the transistor body. Halo regions include second polarity type dopants for first polarity type transistor. For example, the halo regions include p-type dopants for a n-type transistor while the LDD regions include n-type dopants for n-type transistors. The halo and LDD regions extend under the gate. A halo region extends beyond the LDD region under the gate and extend to a depth deeper than the LDD regions with reference to the substrate surface. Other configurations of the LDD and halo regions may also be useful.

In one embodiment, the first and second halo regions 644 and 646 include asymmetrical configuration. For example, the halo regions include different dopant concentration or depth to adjust the Vt across the first and second S/D terminals. In one embodiment, the second halo region 646 at the second S/D terminal 246 includes a dopant concentration that is higher than the dopant concentration of the first halo region 644 at the first S/D terminal 245. For example, the second halo region 646 includes a dopant concentration higher than $2E18/cm^3$ and the first halo region 644 includes a dopant concentration lower than $1E18/cm^3$. In such case, the Vt at the source terminal 246 is higher than the Vt at the drain terminal 245.

In another embodiment, the S/D terminals include an asymmetrical LDD region. For example, the first S/D terminal 245 is provided with a LDD region 234 while the second S/D terminal 246 is devoid of a LDD region. The asymmetrical LDD configuration provides higher resistance at the source terminal 246 and a lower resistance at the drain terminal 245 of the transistor 240.

The embodiments as described in FIGS. 6a-6b results in advantages similar to that of FIGS. 2a-2d and FIGS. 3a-3b. For example, by providing asymmetrical halo or LDD regions, different resistance is formed at the source and drain terminals 245 and 246, leading to an unequal bidirectional write currents where $I_{W2}$ is lower than $I_{W1}$. In addition, these configurations improve RDM of the memory cell and are highly compatible with logic processes.

Figure 7B:
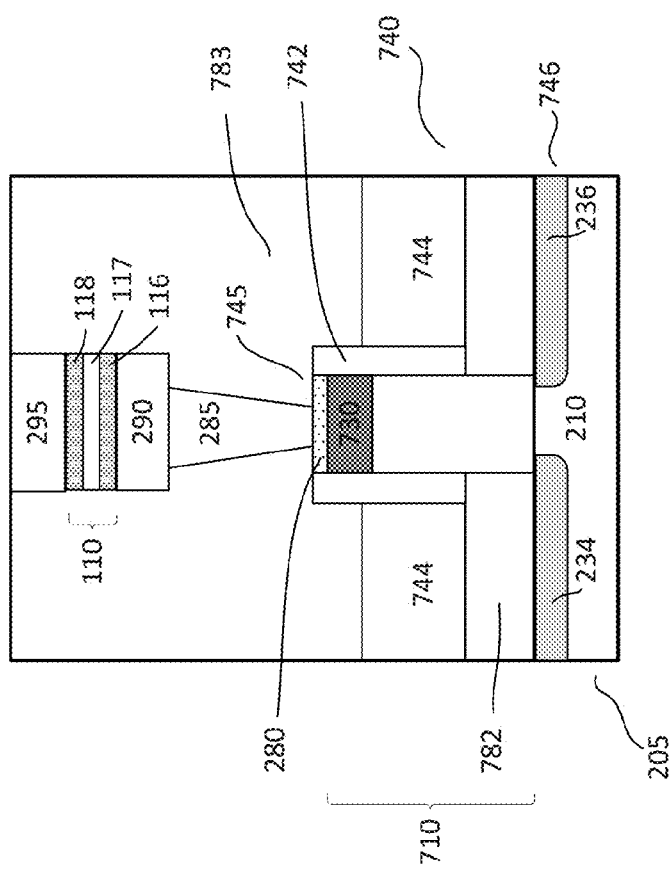
Figure 7A:
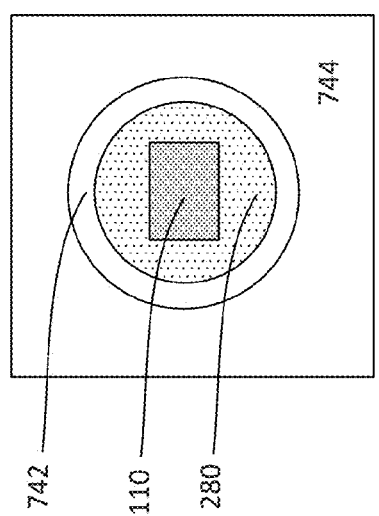
FIG. 7a shows a top view of an embodiment of a device.
Figure 7D:
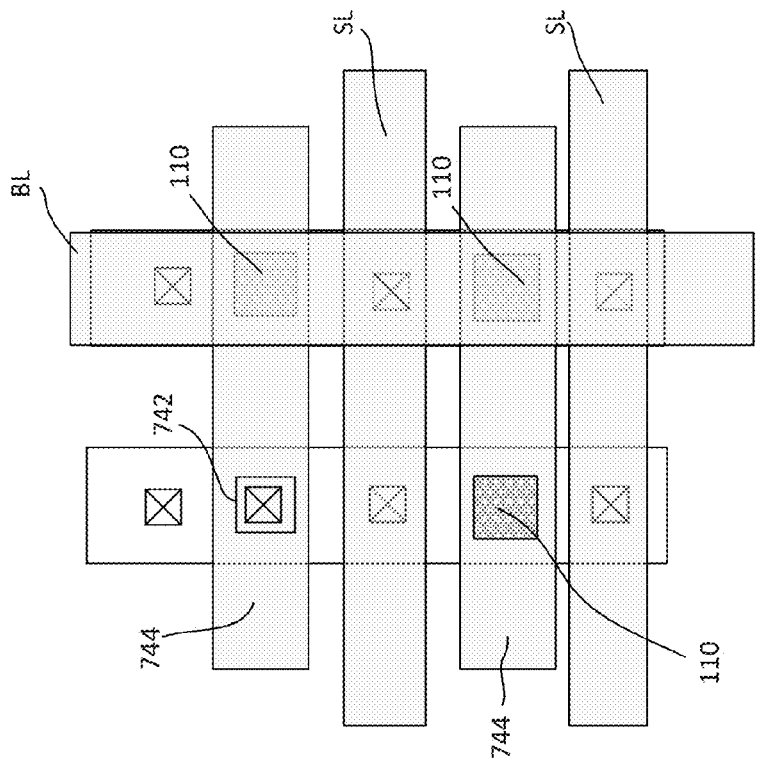
FIGS. 7c-7d show various embodiments of a top layout of the device.
Figure 7C:
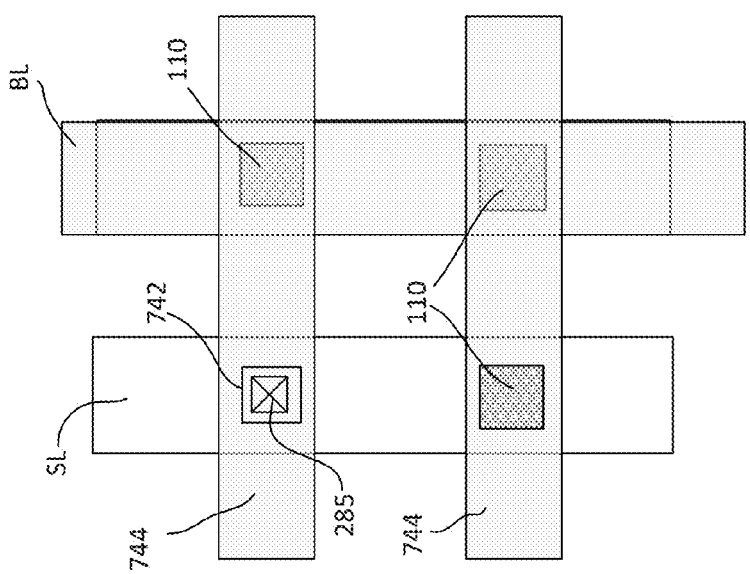

FIGS. 7a-7d show various views of an embodiment of a device 700. FIG. 7a shows a simplified top view of the device, FIG. 7b shows a cross-sectional view of the device while FIGS. 7c-7d show various embodiments of a top layout of the device. The device, as shown, includes a memory cell. The memory cell, for example, may be a NVM cell. The memory cell, in one embodiment, is a magnetoresistive NVM cell, such as a STT-MRAM cell. The memory cell, for example, is similar to that described in FIGS. 1a-1c and FIGS. 2a-2d. Common elements and features having the same reference numerals may not be described or described in detail. In the interest of brevity, the description of the device below primarily focuses on the difference(s) compared with the device 200 shown in FIGS. 2a-2d.

The memory cell is disposed on a substrate 205. The substrate 205, in one embodiment, includes a silicon substrate having a body well 210 similar to that shown in FIG. 2a. For example, the body well 210 encompasses the first and second LDD regions 234 and 236.

The select transistor 740, in one embodiment, is a vertical select transistor formed in the cell region on the substrate 205. The vertical select transistor includes first and second S/D terminals 745 and 746 and a gate disposed between the S/D terminals. In one embodiment, the first and second S/D terminals 745 and 746 correspond to the first and second S/D terminals 145 and 146 while the gate corresponds to the gate terminal 144 as described in FIG. 1c.

A base 710 of the transistor is disposed on the substrate and in contact with the first and second LDD regions 234 and 236 and the body well 210. The LDD regions 234 and 236, for example, extend slightly under the base 710. The base, in one embodiment, is a nanowire base. The nanowire may have a circular cross-sectional shape. The cross-sectional dimension of the nanowire may be about 1F. Other cross-sectional shapes or dimensions for the nanowire and other suitable types of bases may also be useful. In one embodiment, the base is a vertical base. The base may be disposed on the substrate along a vertical direction perpendicular to the substrate surface.

In one embodiment, the second LDD region 236 serves as the second S/D terminal 746 of the select transistor 740. For example, the second LDD region 236 is coupled to a SL (not shown) of the memory cell. The SL may be an interconnect line similar to that described in FIGS. 2a-2d. In such case, a contact plug may provide a vertical connection from the second LDD region 236 to the SL. For example, a metal silicide contact (not shown) is disposed on the end of the second LDD region, which is displaced away from the base 710. A contact plug (not shown), for example, connects the metal silicide contact of the second LDD region 236 to the SL disposed in the first metal level M1. It is to be understood that the SL may also be an interconnect line disposed in an upper metal level above M1, depending on design requirements.

In another embodiment, the SL of the memory cell may be a buried SL (not shown) which is coupled to a SL driver. For example, the cell region may include a buried SL disposed within the substrate. The buried SL, in one embodiment, is a first polarity type doped region disposed along a row or BL direction. For example, a n-type doped region may form the buried SL. The dopant concentration of the buried SL may be about $1E18$-$1E20/cm^3$. Other dopant concentrations for the buried SL may also be useful. In the case where a buried SL is provided, the second LDD region 236 may form the buried SL of the memory cell. For example, the second LDD region 236 extends along the row or BL direction and serves as a common second S/D terminal 746 for a row of memory cells. Other types of buried SL may also be provided. For example, the buried SL of the memory cell may also be formed by a n-type doped well region positioned below and in communication with the second LDD region 236.

The select transistor 740, in one embodiment, is provided with asymmetrical configurations of first and second S/D terminals. The select transistor includes a first S/D terminal 745 disposed at the top of the base 710 and a second S/D terminal 746 disposed in the substrate. For example, the first S/D terminal 745 is coupled to the BL and the second S/D terminal 746 is coupled to the SL. In one embodiment, the select transistor is configured such that the resistance in the first S/D (or drain) terminal 745 is lower than the second S/D (or source) terminal 746. The drain terminal 745 includes a heavily doped S/D region 730 disposed at the top of the base 710. The source terminal 746 includes a LDD region 236 disposed in the substrate. For example, the source terminal 746 is devoid of a heavily doped S/D region. In such case, the heavily doped S/D region 730 provides the drain terminal 745 with a lower resistance and the second LDD region 236 provides the source terminal 746 with a higher resistance. As shown, a metal silicide contact 280 is disposed on the heavily doped S/D region 730. The portion of the base below the S/D region 730 serves as a body of the transistor. In one embodiment, the body includes a vertical channel. For example, the channel is disposed perpendicular to the plane of the substrate surface. A height of the channel is equal to its channel length. The channel length is, for example, about 10-100 nm. Other suitable channel length may also be useful.

An isolation layer 782 may be provided to isolate device regions from other regions. In one embodiment, the isolation layer is provided to isolate memory cells from each other. The isolation layer is disposed on the top surface of the substrate 205 and around the base 710. The isolation layer, in one embodiment, is silicon oxide. In other embodiments, the isolation layer may be silicon nitride. Other suitable types of isolation layers, including multiple isolation layers, may also be useful. The isolation layer may also serve to electrically isolate a gate of the transistor from the substrate 205. The thickness of the isolation layer, for example, may be about 200-400 nm. Other suitable thickness ranges may also be useful. A thicker isolation layer provides better isolation.

A gate surrounds the base, forming a gate-all-around (GAA) transistor. The gate includes a gate electrode 744 and a gate dielectric 742. The gate electrode, for example, surrounds the gate dielectric. The gate dielectric lines the sidewalls of the base 710 and the heavily doped S/D region 730. The gate dielectric, for example, extends from the top of the isolation layer 782 to form a coplanar top surface with the metal silicide contact 280. The gate dielectric may be silicon oxide. For example, the gate dielectric may be thermal oxide. The thickness of the gate dielectric may be about 20 Å. Other types of gate dielectric or dimensions may also be useful. As for the gate electrode, it may be polysilicon. The thickness of the gate electrode surrounding the base may be about 300 Å. Other types of gate electrodes or dimensions may also be useful. In one embodiment, the gate electrode layer is disposed on the top surface of the isolation layer 782 and around the base 710. The gate dielectric, for example, separates the gate electrode 744 from the base 710. The gate electrode may a gate conductor extending horizontally. For example, the gate electrode may extend in the column or WL direction. The gate electrode may be a common gate electrode along the WL direction, forming a column of memory cells.

A device may include a plurality of dielectric layers to form different ILD levels. As illustrated, the dielectric layer 783 may include a dielectric stack having multiple dielectric layers over a first contact level. For example, the first contact level includes contact plugs 285 and the metal level includes metal lines. The metal lines may form interconnect lines or interconnect pads. The metal lines, for example, may be about IF wide and 450 Å thick. Other dimensions may also be useful. The dielectric layer 783 is similar to the dielectric layer 283 described in FIGS. 2a-2d. Common elements may not be described or described in detail. In one embodiment, the contact plug 285 directly connects the first S/D terminal 745 of the select transistor to an interconnect pad 290 disposed in a lower metal level, such as a first metal level M1. The storage unit 110 of the memory cell may be disposed between the upper metal level and M1. For example, the storage unit is disposed on the interconnect pad 290 and is coupled to an interconnect line 295 which serves as the BL.

The BL is coupled to the storage unit 110, the SL (not shown in FIG. 7b) is coupled to the select transistor 740 and a WL (not shown) is coupled to the gate electrode. FIGS. 7c and 7d illustrate various embodiments of a top layout of the device. Some of the layers are removed at selected part of the top view of the layout to show the underlying layers. In one embodiment, the BL and SL are disposed along a first direction as shown in FIG. 7c. In such case, the SL may be a buried SL disposed in the substrate. The BL and SL couple a plurality of memory cells along the first direction, forming a row of memory cells. The WL is along a second direction. The WL couples a plurality of select transistors in the second direction, forming a column of memory cells. A plurality of BLs, WLs and SLs form a plurality of rows and columns of memory cells of an array as shown in FIG. 7c. Other configurations of BLs, WLs and SLs may also be useful. Although parallel BL and SL are illustrated, it is to be understood that the BL and SL may also be orthogonal a shown in FIG. 7d. In such case, the SL may be an interconnect line disposed in a different metal level than the BL.

The embodiment as described in FIGS. 7a-7d results in various advantages similar to that of FIGS. 2a-2d and FIGS. 3a-3b. For example, by providing asymmetrical source and drain terminals 746 and 745 for the GAA vertical select transistor, different resistance is formed at the S/D terminals, leading to unequal bidirectional write currents where $I_{W2}$ is lower than $I_{W1}$.

FIGS. 8a-8j show cross-sectional views of an embodiment of a process 800 for forming a device. The device formed by the process 800, for example, is the same or similar to the device 200 as described in FIGS. 2a-2d. Common elements may not be described or described in detail. Although the cross-sectional views show one memory cell, it is understood that the device may include a plurality of memory cells of a memory array. In one embodiment, the process of forming the STT-MRAM cell is highly compatible with the CMOS logic process. For example, the STT-MRAM cell can be formed simultaneously with CMOS logic devices (not shown) on the same substrate.

Referring to FIG. 8a, a substrate 205 is provided. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a bulk crystalline by a buried insulator layer. The buried insulator layer, for example, may be formed of an insulating material. The buried insulator layer, for example, is formed from silicon oxide, which provides a buried oxide (BOX) layer while the surface and bulk crystalline layers are single crystalline silicon. In such case, the COI substrate is a SOI substrate. Other types of COI substrates may also be useful. It is understood that the surface and bulk layers need not be formed of the same material.

A ground plane (not shown) may optionally be provided in an SOI substrate. The ground plane, for example, is formed by implanting any suitable types of n-type or p-type dopants. The implant parameters, such as energy and dose, are tailored to produce ground plane at the desired location and have the desired effect. By adjusting the energy and dose of the implant, the location and thickness of the ground plane can be controlled. The thickness of the ground plane layer is, for example, 5-100 nm. Other suitable techniques for forming the ground plane layer may also be useful.

Referring to FIG. 8a, isolation regions 880 are provided. In one embodiment, the isolation regions are STI regions. Other types of isolation regions may also be useful. The isolation regions are provided to isolate device regions from other regions. In one embodiment, isolation regions may be provided to isolate columns of memory cells. Isolation regions may be provided to isolate different memory array banks. Other configurations of isolation regions may also be useful. Isolation regions may be formed by, for example, etching trenches in the substrate and filling them with a dielectric material, such silicon oxide. A planarization process, such as chemical mechanical polish (CMP), is performed to remove excess dielectric material to form the STI regions isolating the device regions. Other processes or materials can also be used to form the STI. The STI region, for example, extends to a depth of about 2000-5000 Å. Providing STI regions which extend to other depths may also be useful. In the case where the substrate is an SOI substrate, the STI is disposed in the surface substrate layer and the depth of the STI should extend to contact the buried insulator layer.

Figure 8B:
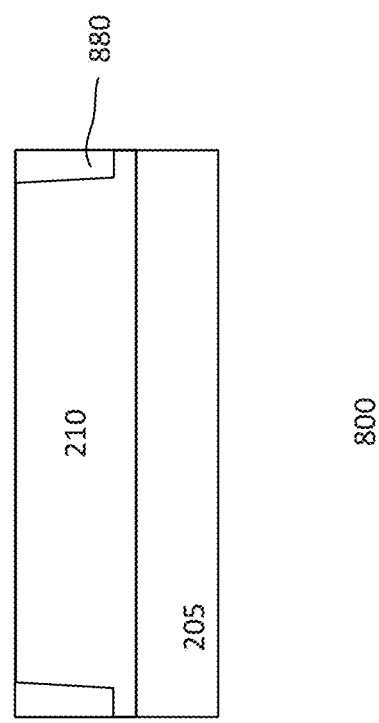

The process continues to form a body well 210 for transistors of the memory cell as shown in FIG. 8b. The substrate may be doped with second polarity type dopants to form the body well for first polarity type transistors. The body well may be a common well for the cell device regions in the array region. For example, the body well may be an array well. The body well may be formed by, for example, ion implantation. The body well, for example, may be formed using an implant mask (not shown), such as a patterned photoresist mask. Other techniques in forming the body well may also be useful. The body well are formed after forming the isolation regions 880.

Referring to FIG. 8c, a select transistor 240 of a cell selector unit is formed on the substrate. The transistor 240 is, for example, a MOS transistor. Other suitable types of transistors or cell selectors may also be useful.

The transistor 240 includes a gate formed on the substrate and LDD regions 234 and 236 formed in the substrate adjacent to first and second sides of the gate. To form the transistor, layers of the gate may be formed on the substrate. For example, a gate dielectric layer and gate electrode layer may be sequentially formed on the substrate. The gate dielectric layer, for example, may be a silicon oxide layer formed by, thermal oxidation. As for the gate electrode layer, it may be a polysilicon layer formed by chemical vapor deposition (CVD). Other suitable types of gate layers or techniques for forming gate layers may also be useful.

The gate layers may be patterned to form the gate of the transistor 240. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to location where the gate layers are to be removed. To improve lithographic resolution, an anti-reflective coating ARC (not shown) may be used below the photoresist layer. The patterned mask layer is used to pattern the gate layers. For example, an anisotropic etch, such as RIE, is used to remove exposed portions of the gate layers. Other types of etch processes may also be useful. The etch transfers the pattern of the mask layer to the underlying gate layers. Patterning the gate layers define the gate electrode 244 and gate dielectric 242 of the select transistor. The gate, for example, may be a gate conductor along a WL direction. A gate conductor forms a common gate for a row or column of memory cells.

Optionally, gate layers may be provided to form a dummy gate structure (not shown) over the substrate. A dummy gate structure includes a dummy gate dielectric and dummy gate electrode. The dummy gate electrode, for example, includes polysilicon and the dummy gate dielectric, for example, includes silicon oxide. Various other suitable materials and techniques may be employed to form the dummy gate layers. For example, the dummy gate structure should include materials which can be removed or etched selectively to layers below or around it. The dummy gate layers may be formed by, for example, CVD covering the device region. Other techniques, such as sputtering or spin coating may also be useful, depending on the material of the dummy layers.

The process may continue to form dielectric liners 243. For example, thermal oxide layers line the sides of the patterned gate electrode and gate dielectric layers 244 and 242 and crystalline substrate surface. Other techniques for forming dielectric liners or other types of dielectric liners may also be useful. The dielectric liners 243 may be referred to as first sidewall spacers.

The LDD regions 234 and 236 are formed after forming the gate. Substrate portions adjacent to first and second sides of the gate are lightly doped with first polarity type dopants to form the LDD regions. In one embodiment, an implant is performed to form the LDD regions in the substrate adjacent to first and second sides of the gate and slightly underlap the gate. The LDD regions include dopant concentration of about, for example, 1E18-5E19/cm³. Other dopant concentrations of LDD regions may also be useful.

Figure 8D:
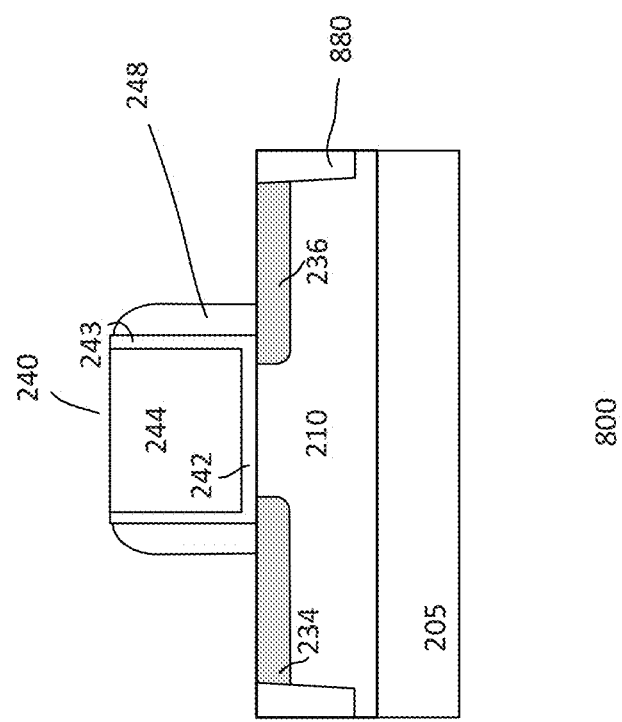

Referring to FIG. 8d, second sidewall spacers 248 are formed on sidewalls of the gate 240. To form the spacers 248, a dielectric spacer layer, such as silicon nitride, is formed on the substrate covering the gate. The spacer layer may be formed by CVD. Other suitable dielectric materials and techniques for forming the spacer layer may also be useful. An anisotropic etch, such as RIE, is performed to remove horizontal portions of the spacer layer, leaving spacers 248 to abut the first sidewall spacers 243 adjacent to the sidewalls of the gate.

The process continues to form S/D regions on exposed portions of the substrate. A S/D region may include heavily doped region with first polarity type dopants. In one embodiment, the S/D regions include heavily doped raised S/D portions. In other embodiments, S/D regions include heavily doped base S/D portions. Base S/D portions are formed by implanting first polarity type dopants into the exposed substrate portions. The base S/D portions include a depth of about 5-20 nm. Other suitable depth dimensions and dopant concentration may also be useful. An implant mask (not shown) may be employed to prevent other parts of the device from being implanted with dopants.

Figure 8E:
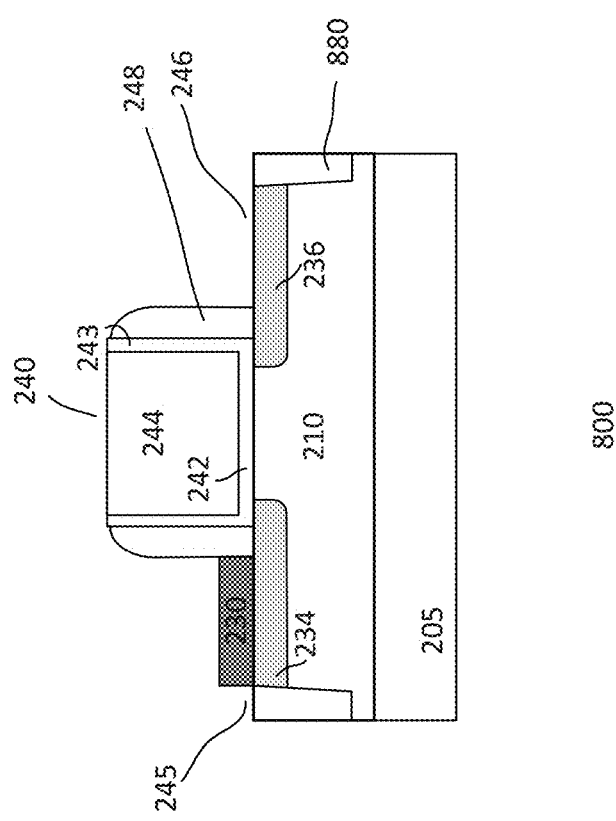

In accordance with an embodiment, a raised S/D region 230 without a base S/D portion is formed adjacent to a drain terminal 245 side (or drain side) of the gate as shown in FIG. 8e. The raised S/D region 230 is formed by selective epitaxial growth (SEG) process. The SEG process selectively forms an epitaxial layer on exposed surface portions of the substrate. The epitaxial layer formed over the LDD region 234 in the cell region may be formed as part of the process for forming first polarity type epitaxial raised S/D regions of logic transistors in other logic regions (not shown) on the same substrate. In one embodiment, the SEG process selectively forms a crystalline epitaxial layer on the exposed surface of the drain terminal 245 while the source terminal 246 is devoid of an epitaxial layer. For example, a protective mask (not shown) is patterned to expose the first LDD region 234 while protecting the second LDD region 236, which is adjacent to a source terminal 246 side (or source side) of the gate, from the SEG process. This forms an asymmetrical S/D region having one-sided raised S/D portion at the drain side of the select transistor. The epitaxial layer is heavily doped with first polarity type dopants to form a heavily doped raised S/D portion 230. The dopants may be incorporated into the raised S/D portion by in-situ doping. Heavily doping the epitaxial layer by ion implantation using an implant mask may also be useful. Other techniques for incorporating the dopants into the epitaxial layer may also be useful.

Figure 8F:
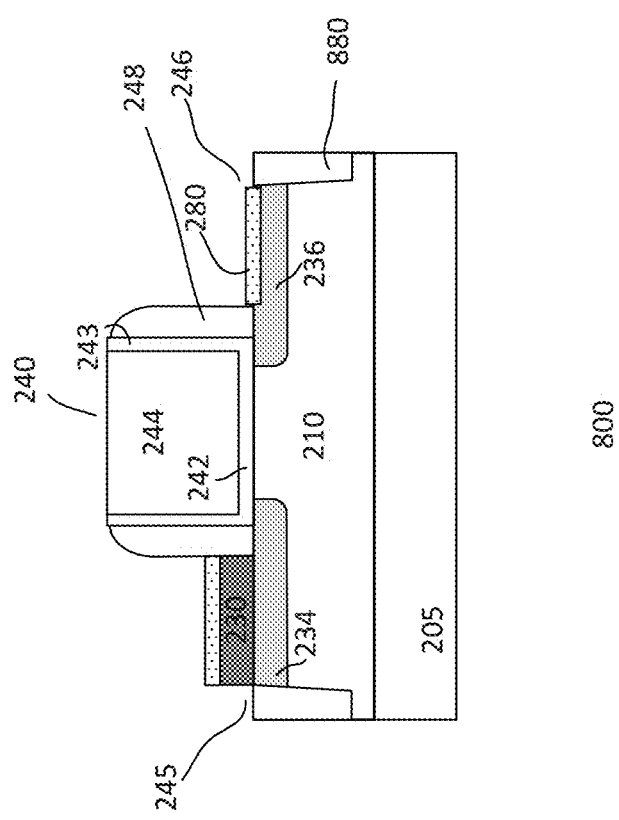

Referring to FIG. 8f, the process continues to form metal silicide contacts on the contact regions of the select transistor. For example, metal silicide contacts 280 may be formed on the gate electrode 244 (not shown), raised S/D portion 230 at the drain side 245 and the LDD region 236 at the source side 246 of the transistor. The metal silicide contacts, for example, may be nickel-based metal silicide contacts. Other types of metal silicide contacts may also be useful. A silicidation process may be performed to form silicide contacts. For example, a metal layer may be deposited over the substrate and annealed to cause a reaction with silicon. Unreacted metal is removed by, for example, a wet etch, leaving the silicide contacts on the contact regions.

Figure 8G:
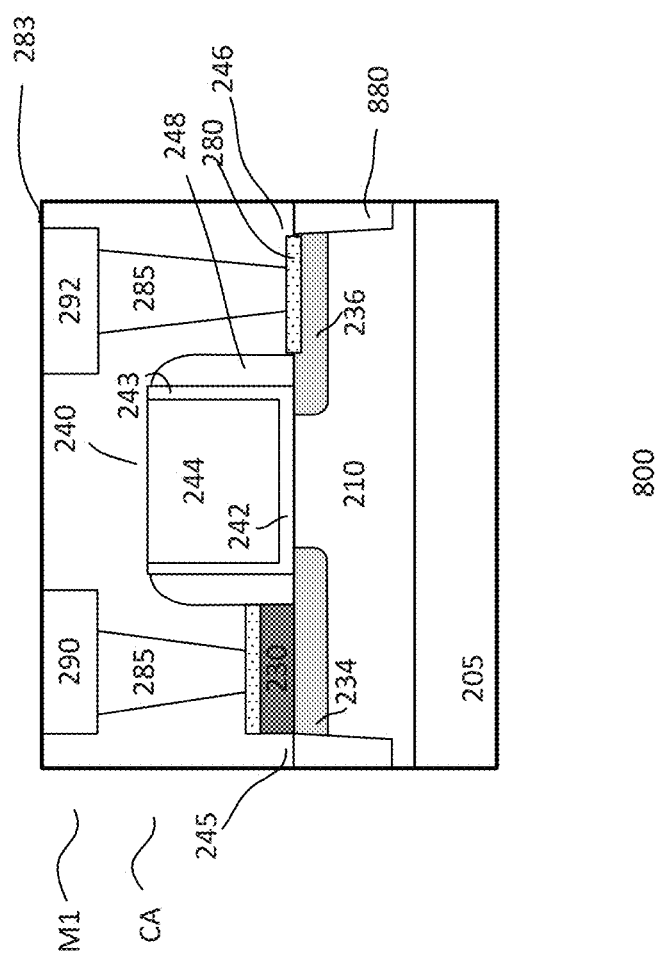

Referring to FIG. 8g, an ILD layer 283 is formed over the substrate, covering the select transistor 240. The ILD layer, for example, is a silicon oxide layer. The ILD layer may be a high aspect ratio process (HARP) dielectric layer. Other types of dielectric materials including BPSG, PSG, USG, TEOS oxide, PEOX, HDP oxide, etc., may also be useful. The ILD layer, for example, may be formed by CVD. Other suitable techniques may also be useful. The ILD layer includes a first contact level or PMD layer in which contact plugs 285 are formed to contact regions of the substrate.

In an alternative embodiment, the ILD layer may be formed to facilitate the process of forming a replacement metal gate. For example, in the case where a dummy gate structure is formed, the ILD layer is planarized to form a co-planar top surface with the dummy gate. For example, a CMP is performed to planarize the ILD layer and dummy gate. After planarization, the exposed dummy gate is selectively removed. Removal of the dummy gate may be performed by dry etch, wet etch or a combination thereof. For example, a wet etch selective to the ILD layer and sidewall spacers may be performed. The dummy gate may be removed by wet etch using different chemistries. Alternatively, the dummy gate may be removed by dry etch at one go with different sub-steps. Removal of the dummy gate leaves a gate trench on the substrate.

A metal gate may be formed on the substrate in the gate trench. Forming the metal gate includes forming a high-k gate dielectric layer on the substrate. The high-k gate dielectric layer lines the gate trench and ILD layer. The high-k gate dielectric layer, for example, may be $HfO_2$, HfSiON, $La_2O_3$, zirconium oxide or silicates thereof formed by atomic layer deposition (ALD) process. A metal gate electrode layer, such as TaN or TiN, may be formed over the high-k gate dielectric layer by ALD, CVD or physical vapor deposition (PVD) to fill the remaining gate trench. Other types of high-k gate dielectric materials, metal gate electrode materials or forming techniques may also be useful. These layers are planarized, forming a planar top surface between the ILD and the replacement metal gate which includes the high-k gate dielectric and metal gate electrode. The process may continue to deposit additional ILD layers over the replacement gate to form the PMD layer.

Referring back to FIG. 8g, contact plugs 285 are formed in the ILD layer 283. To form the contact plugs, a soft mask (not shown) may be used to form via or contact openings to the contact regions. The soft mask, for example, is a photoresist mask. To improve lithographic resolution, an ARC may be provided between the dielectric layer and soft mask. The soft mask is patterned to form openings corresponding to the contact regions. A conductive layer is then formed on the substrate, filling the openings and covering the dielectric layer 283. A planarizing process, such as CMP, removes excess conductive layer, forming contact plugs having a planar surface with the top surface of the ILD layer. Other techniques for forming contacts may also be useful. The process may continue to form the first metal level M1 of the ILD layer.

To form the first metal level, a damascene process may be employed. For example, an additional dielectric layer is formed over the substrate covering the coplanar surface of the ILD layer and contact plugs. The dielectric layer, for example, may be silicon oxide. Other types of dielectric materials, such as TEOS or SiCOH, may also be useful. The dielectric layer is patterned to form trenches corresponding to the metal lines 290 and 292. The metal line 292, for example, serves as the SL. As shown, the SL is coupled to the source terminal 246. The dielectric layer may be patterned using a patterned soft mask, such as photoresist (not shown). The trenches are filled with a conductive material, such as copper or copper alloy. Other types of conductive materials may also be useful. Excess conductive material is removed by, for example, CMP, forming the metal lines. Other techniques for forming metal lines may also be useful. Additional dielectric layers may be provided thereover to form other ILD levels.

Figure 8H:
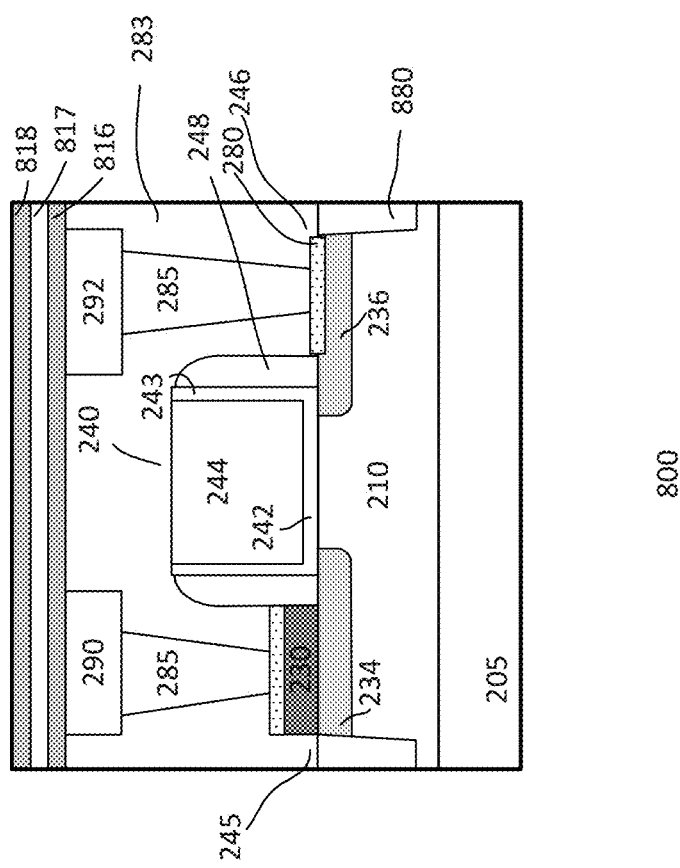

Referring to FIG. 8h, the process continues to form a MTJ stack that includes multiple thin-film layers. The MTJ stack, for example, may be formed in an ILD level in between metal level M1 and an upper metal level. Forming the MTJ stack in between other metal levels may also be useful. Forming the MTJ stack may include forming a first magnetic layer 816 to cover a conductive bottom electrode layer (not shown), a first barrier layer 817 is formed to cover the first magnetic layer and a second magnetic layer 818 is formed to cover the first barrier layer. A top electrode layer (not shown) is formed to cover the second magnetic layer 818. In one embodiment, the first magnetic layer 816 is a fixed layer and the second magnetic layer is a free layer 818. For example, the MTJ stack is configured to form a bottom-pinned MTJ element 110. Other configurations of MTJ stack may also be useful. For example, the MTJ stack may be configured to form a top-pinned MTJ element. The MTJ stack may be formed using one or more deposition processes such as PVD or CVD. The various layers may include any suitable thickness dimensions and may be formed by other suitable techniques.

Figure 8I:
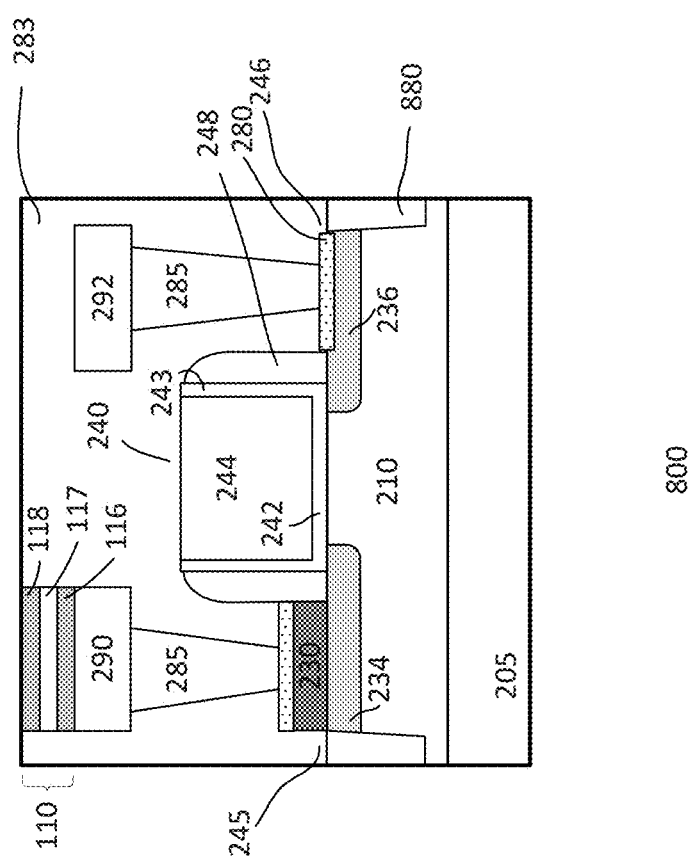

A suitable mask and etch process, such as photoresist masking and etching may be used to pattern and remove excess portions of the MTJ stack to form a MTJ element 110. To improve lithographic resolution, an ARC layer may be provided between the mask and top electrode layer. The mask layer is patterned to form openings. The openings correspond to areas where the top electrode layer and MTJ layers are to be removed. An etch, such as RIE, removes exposed top electrode and MTJ layers. Multiple etches may be employed due to the different materials. The etch, as shown, leaves an MTJ element 110 of a storage unit with top and bottom electrodes (not shown) as illustrated in FIG. 8i. Other techniques to form the MTJ element may also be useful. After forming the MTJ stack, the mask layer used to pattern the MTJ stack is removed.

Referring to FIG. 8i, a storage dielectric layer is formed over and covers the MTJ stack. The storage dielectric layer, for example, is a silicon oxide layer. The storage dielectric layer may be formed by, for example, CVD. Other types of storage dielectric layers or forming techniques may also be useful. A planarization process is performed to remove excess dielectric material to form a planar surface. The planarization process, for example, is CMP. The planarization process exposes the top of the MTJ stack and provides a coplanar surface between the MTJ stack and the storage dielectric layer.

An additional dielectric layer (not shown) is formed over the substrate, covering the top surfaces of the MTJ stack and storage dielectric layer. The dielectric layer, for example, serves as a metal level of an ILD layer. In one embodiment, the dielectric layer serves as a metal level of the storage dielectric level. For example, the dielectric layer serves as M2 while the storage dielectric layer serves as VI. Other ILD levels may also be useful. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed to produce a planar surface.

Figure 8J:
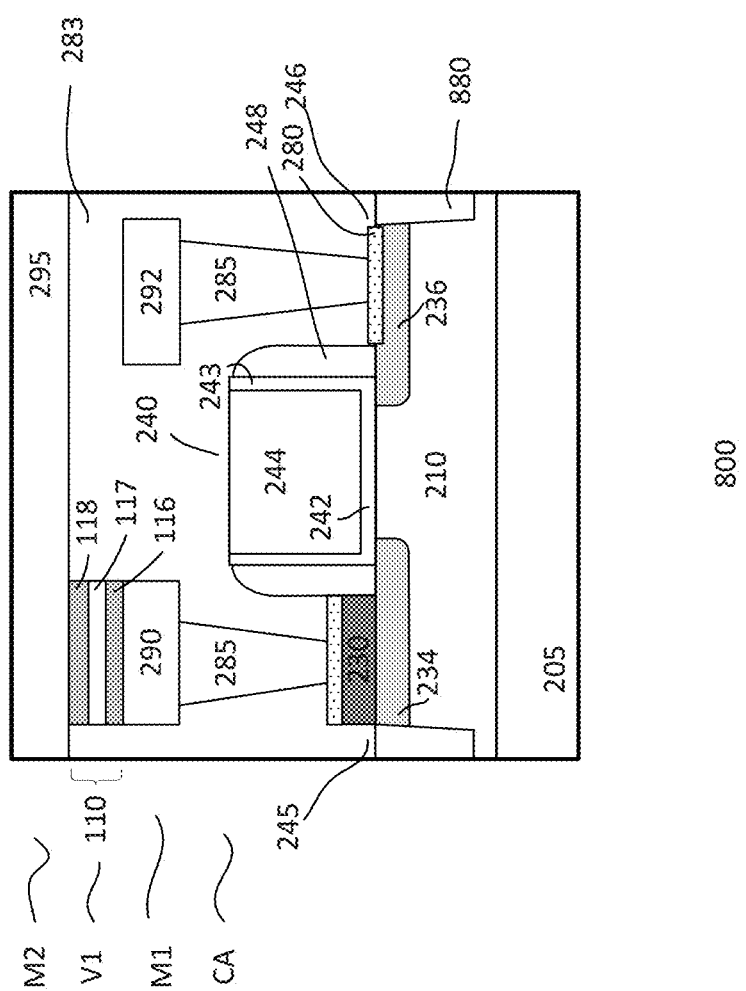

As shown in FIG. 8j, a conductive or metal line 295 is formed in the additional dielectric layer and on the MTJ stack. The metal line may be formed using, for example, damascene technique. The metal line 295, for example, serves as a BL. As shown, the drain terminal 245 is coupled to the MTJ stack 110 which is connected to the BL.

The process may continue to complete the memory cell. For example, BEOL process including additional interconnect metal levels may be provided to form interconnections to other circuit components, as desired. Other processes may also be included to complete the memory cell or device, for example, final passivation, dicing and packaging.

Although the storage unit of the memory cell as described above includes a MTJ stack such as that shown in FIGS. 2a-2d, it is understood that other suitable configurations of MTJ stack and other types of MTJ stack may be used. Furthermore, the MTJ stack as illustrated is formed in between M1 and M2. It is to be understood that the MTJ stack may be formed in between any suitable adjacent upper metal levels.

The embodiment as described in FIGS. 8a-8j forms a device having various advantages similar to that described in FIGS. 2a-2d. Moreover, the process 800 as described is highly compatible with logic processing. This avoids the investment of new tools and does not require creating new low temperature modules or processing, providing a cost effective solution.

FIGS. 9a-9e show cross-sectional views of another embodiment of a process 900 for forming a device. The device formed by process 900 is the same or similar to the device 300 as described in FIGS. 3a-3b and the process 900 may contain similar steps as that described in FIGS. 8a-8j. In the interest of brevity, common elements may not be described or described in detail.

Figure 9A:
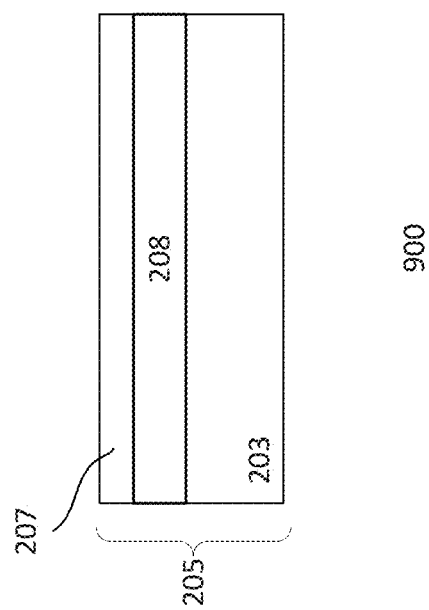
FIGS. 9a-9e show cross-sectional views of another embodiment of a process for forming a device.

Referring to FIG. 9a, a substrate 205 is provided. In one embodiment, the substrate is an SOI substrate having a buried insulator layer 208 sandwiched between a bulk crystalline layer 203 and a surface crystalline layer 207. Other suitable types of substrate may also be useful.

Isolation regions (not shown) may be formed in the substrate. The isolation regions serve to isolate the cell region from other device regions (not shown). The isolation regions, for example, are shallow trench isolation (STI) regions. Other types of isolation regions may also be useful. In the case where the substrate 205 is an SOI substrate, the depth of the STI should extend to contact the buried insulator layer 208. The process to form the STI regions in the surface crystalline layer may include materials and techniques similar to that described for forming the STI regions 880 as shown in FIG. 8a, except that the process may be modified by performing a hybrid process to remove portions of the surface crystalline 207 and the buried insulator layer 208 so that a body contact (not shown) can be formed to connect to a ground plane structure in the bulk crystalline layer 203 for back-biasing. The depth of the STI region in an SOI substrate may be shallower than that formed in a bulk crystalline substrate.

Figure 9B:
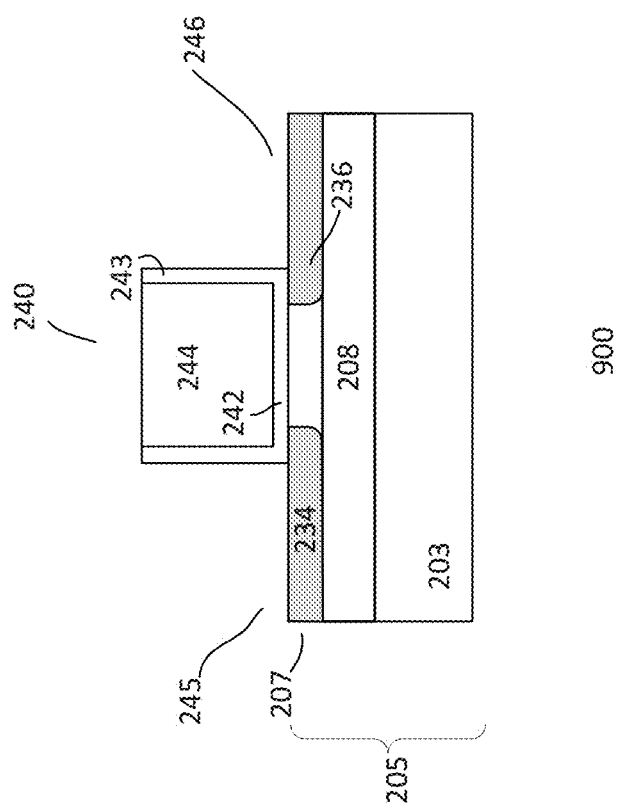

Referring to FIG. 9b, a select transistor 240 of a cell selector unit is formed on the substrate 205. Similar to that described in FIG. 8c, the transistor 240 includes a gate and LDD regions 234 and 236 formed in the surface substrate 207 adjacent to first and second sides of the gate. The LDD regions 234 and 236, as shown, extend to the bottom of the surface substrate 207. Techniques for forming the gate and LDD regions are similar to that described in FIG. 8c. As such, details for forming the LDD regions and transistor gate will not be described.

Figure 9C:
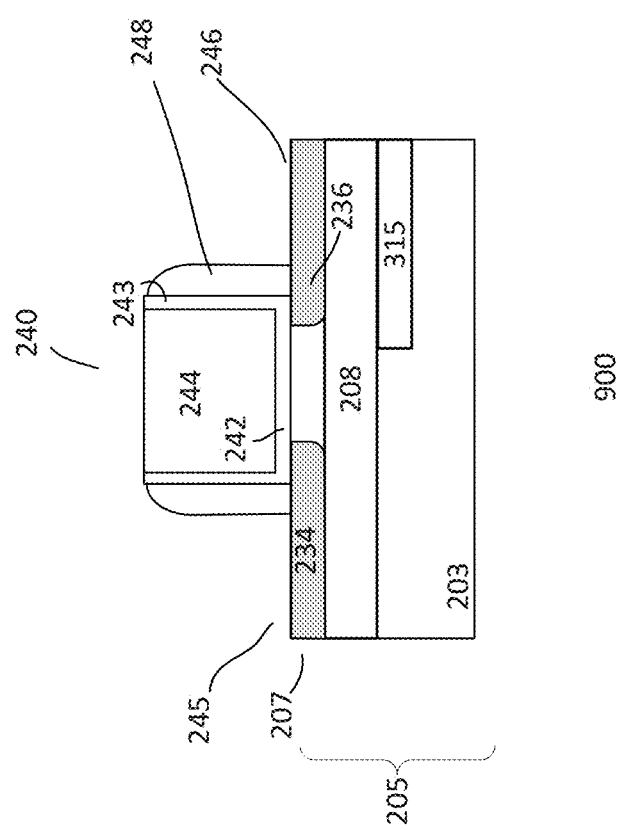

Referring to FIG. 9c, the process continues to form asymmetrical S/D terminals. In one embodiment, a localized ground plane (LGP) is formed in the bulk substrate. The LGP, for example, is formed by implanting any suitable types of n-type or p-type dopants. For example, a high energy implant process is performed on the exposed portions of the substrate to form a LGP below the buried insulator layer 208. The implant parameters, such as energy and dose, are tailored to produce LGP at the desired location and have the desired effect. By adjusting the energy and dose of the implant, the location and thickness of the LGP can be controlled. Other suitable techniques for forming the LGP layer may also be useful. In one embodiment, a protective mask selectively exposes the first or second LDD region to form the LGP. For example, the protective mask may be patterned to protect the first LDD region 234 while exposing the second LDD region 236 to form a LGP 315 below the second S/D terminal 246. In such case, p-type dopants are implanted into a portion of the bulk substrate 203 at the source side 246 of the transistor to form the LGP 315. Other configurations of LGP may also be useful. For example, in another embodiment, the protective mask may selectively expose the first LDD region 234 while covering the second LDD region 236 to form the LGP below the first S/D terminal 245. In such case, n-type dopants are implanted into a portion of the bulk substrate at the drain side 245 of the transistor to form the LGP below the first LDD region 234. The thickness of the LGP is, for example, 5-100 nm. Other thicknesses may also be useful.

Figure 9D:
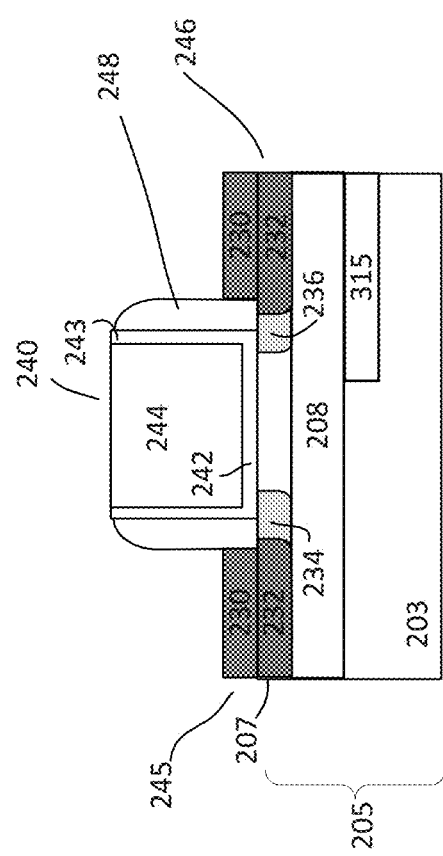

Referring to FIG. 9d, the process continues to form S/D regions similar to that described in FIG. 8e. In one embodiment, heavily doped base S/D portions 232 and raised S/D portions 230 are formed adjacent to first and second sides of the gate. The base S/D portions are formed by implanting first polarity type dopants, such as n-type dopants, into the exposed LDD regions 234 and 236. The base S/D portions may include a depth extending to the top of the buried insulator layer 208. Other suitable depth dimensions may also be useful. Raised S/D portions 230 are formed over the base S/D portions on the substrate surface. Raised S/D portions are formed by SEG. The SEG selectively forms epitaxial layers on exposed portions of the substrate. The epitaxial layers are heavily doped to form the raised S/D portions. The raised S/D portions, for example, are aligned to the sidewall spacers 248 and isolation region (not shown).

Figure 9E:
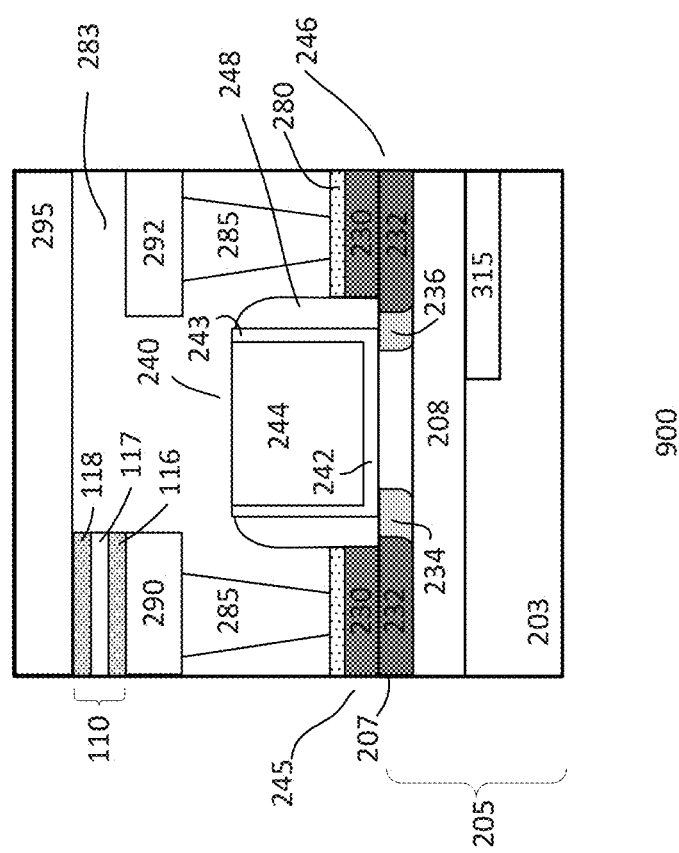

Referring to FIG. 9e, the process continues to complete the memory cell. For example, the process continues to form metal silicide contacts, ILD layer, contacts plugs, MTJ element 110, etc. Additional processes may be performed, including forming additional metal levels, final passivation, dicing, assembly and packaging. Techniques and materials of these features are the same as that already described in FIGS. 8f-8j. As such, details of these steps will not be described.

Figure 10A:
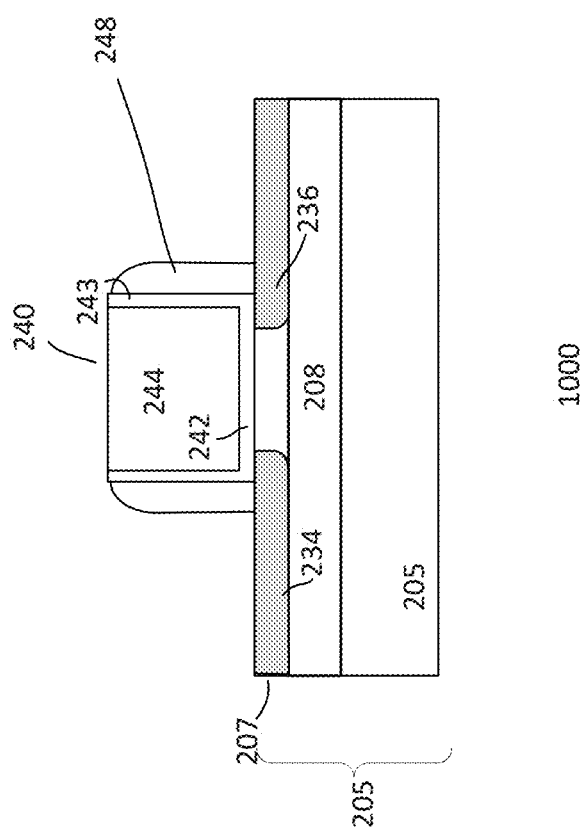
FIGS. 10a-10c show cross-sectional views of an embodiment of a process for forming a device.
Figure 10B:
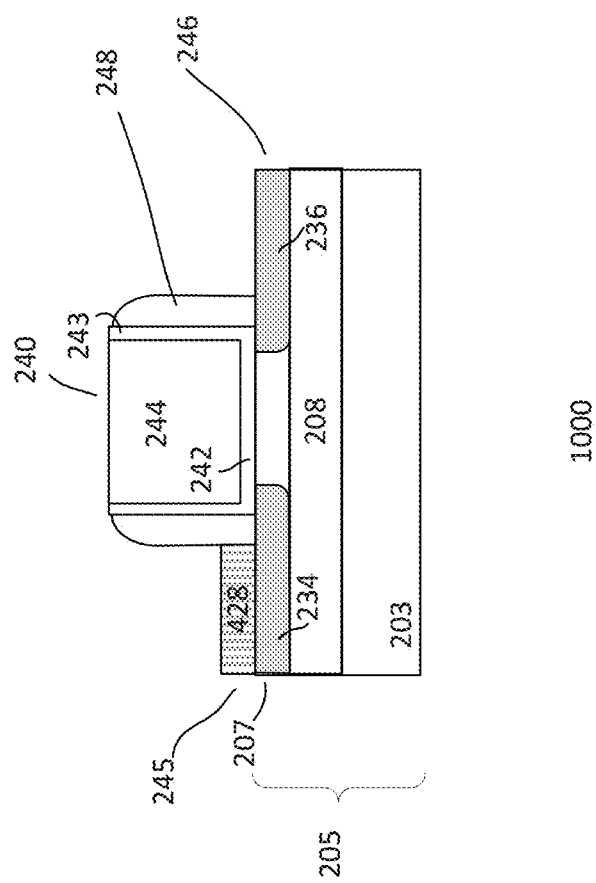
Figure 10C:
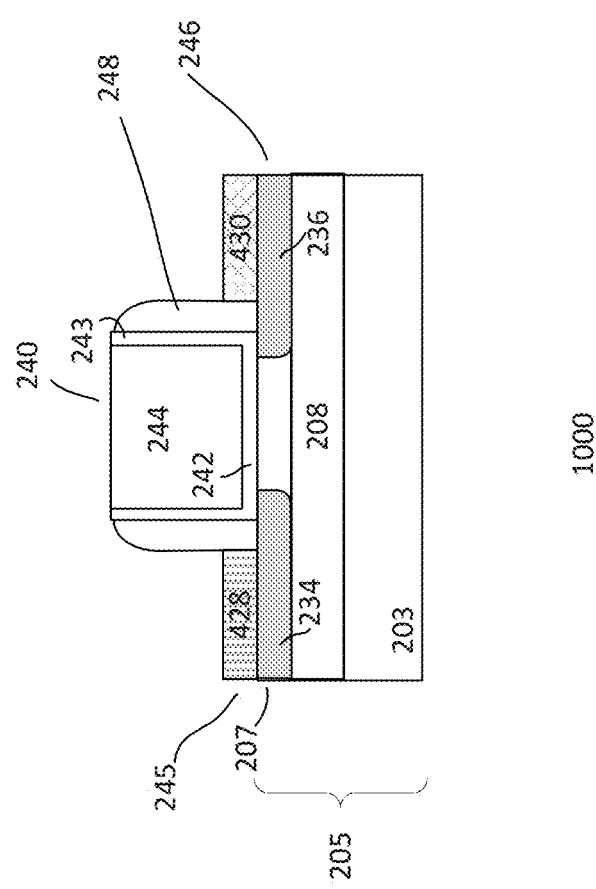

FIGS. 10a-10c show cross-sectional views of an embodiment of process 1000 for forming a device. The device formed by process 1000, for example, is the same or similar to that described in FIGS. 4a-4b and the process may contain similar steps as that described in FIGS. 8a-8j and 9a-9e. In the interest of brevity, common elements may not be described or described in detail. As shown in FIG. 10a, the partially processed substrate is at the stage similar to that described in FIG. 9b.

Referring to FIG. 10b, the process continues to form asymmetrical raised S/D portions. In one embodiment, a first SEG process selectively forms a first epitaxial layer on the exposed surface of the first S/D terminal 245 while a protective mask (not shown) protects the second S/D terminal 246 from the SEG process. The first epitaxial layer may be a stress inducing crystalline layer. The first epitaxial layer is, for example, a carbon doped Si layer (Si:C). Alternatively, the first epitaxial layer may be an epitaxial Si layer without stressor material. The first epitaxial layer is heavily doped with first polarity type dopants to form the raised S/D region 428 at the drain side 245 of the select transistor.

Referring to FIG. 10c, a second SEG process selectively forms a second epitaxial layer on the exposed surface of the second S/D terminal 246 while a protective mask (not shown) protects the first S/D terminal 245 from the SEG process. The second epitaxial layer 430 may be a stress inducing crystalline layer. The second epitaxial layer is, for example, SiGe material. Other suitable crystalline materials may also be used to form the stress-inducing second epitaxial layer. The second epitaxial layer is heavily doped with first polarity type dopants to form the raised S/D region 430 at the source side 246 of the select transistor.

The process continues to complete the memory cell. For example, the process continues to form metal silicide contacts, ILD layer, contacts plugs, MTJ element 110, etc. Additional processes may be performed, including forming additional metal levels, final passivation, dicing, assembly and packaging. Techniques and materials of these features are the same as that already described in FIGS. 8f-8j. As such, details of these steps will not be described.

Figure 11A:
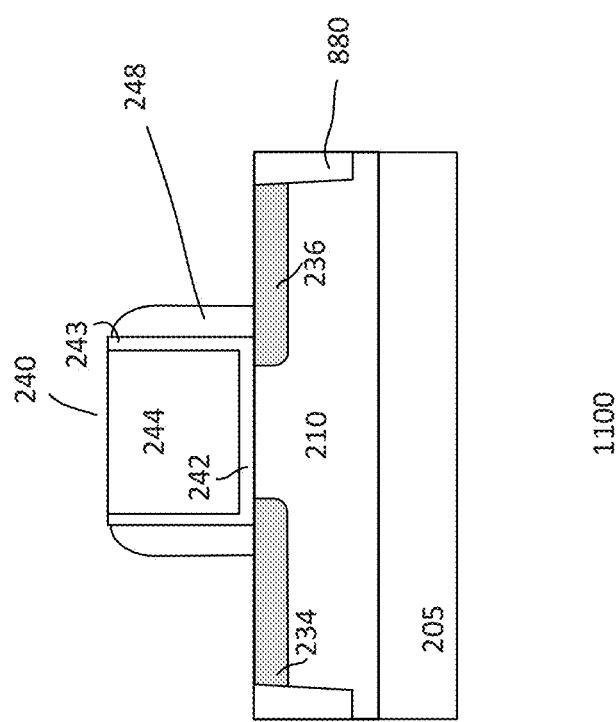
FIGS. 11a-11c show cross-sectional views of another embodiment of a process for forming a device.
Figure 11B:
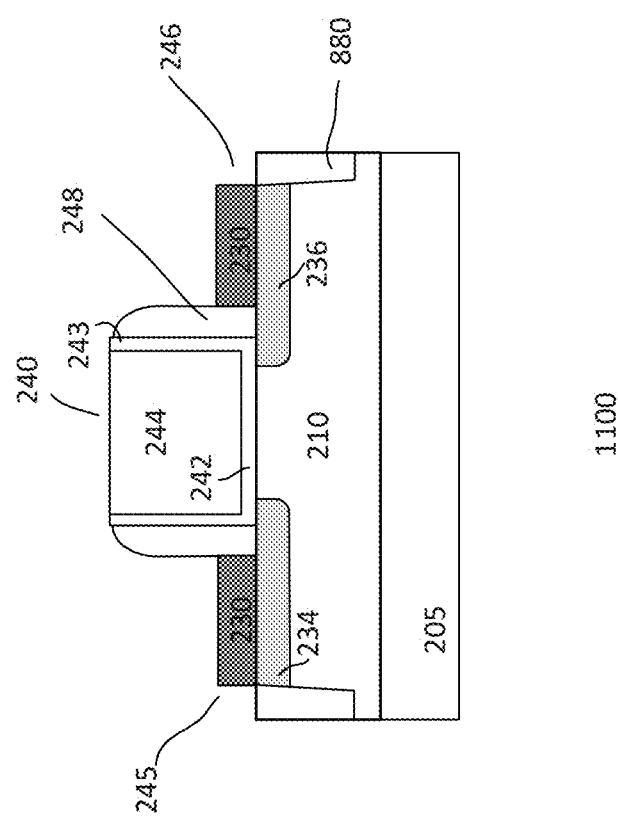
Figure 11C:
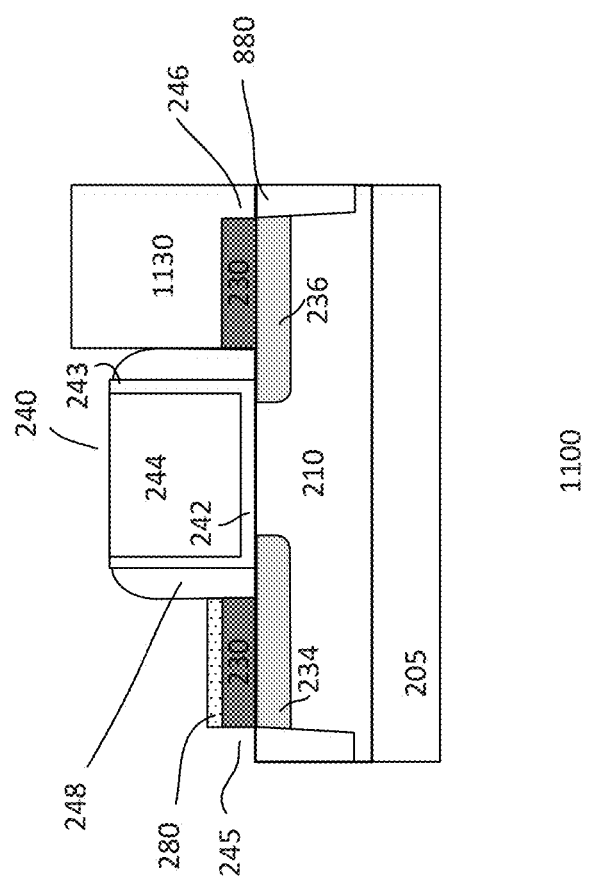

FIGS. 11a-11c show cross-sectional views of another embodiment of a process 1100 for forming a device. The device formed by process 1100, for example, is the same or similar to that described in FIGS. 5a-5d and the process may contain similar steps as that described in FIGS. 8a-8j, 9a-9e and 10a-10c. In the interest of brevity, common elements may not be described or described in detail. As shown in FIG. 11a, the partially processed substrate is at the stage similar to that described in FIG. 8d.

Referring to FIG. 11b, a SEG process selectively forms an epitaxial layer on exposed surface portions of the substrate. In one embodiment, the SEG process forms epitaxial layers on the exposed surface of the first and second S/D terminals 245 and 246. The epitaxial layer is heavily doped with first polarity type dopants to form raised S/D portions 230.

Referring to FIG. 11c, the process continues to form a select transistor 240 with asymmetrical silicide. In one embodiment, the process continues to form metal silicide contacts on exposed contact regions of the select transistor. To form silicide contacts, a metal layer may be deposited over the substrate and annealed to cause a reaction with silicon. Unreacted metal is removed by, for example, a wet etch, leaving the silicide contacts on the contact regions. In one embodiment, a silicide block 1130 is deposited over the second S/D terminal 246. For example, the silicide block extends from the sidewall spacer to overlap the raised S/D portion 230 at the source side 246. Providing a silicide block over the second S/D terminal prevents formation of silicide contact at the source side. This increases contact resistance of the source terminal 246 relative to the drain terminal 245. The silicide block is removed after the silicidation process.

In alternative embodiment, prior to forming the ILD layer, a second silicidation process may be performed to form a second type metal silicide contact on the second S/D region terminal 246. For example, a silicide block (not shown) is deposited over the first S/D terminal 245 to protect the raised S/D portion 230 at the drain side and the metal silicide contact 280 from the second silicidation process. To form the second type metal silicide contact, a metal layer different from metal silicide 280 may be deposited over the substrate and annealed to cause a reaction with silicon. Unreacted metal is removed by, for example, a wet etch, leaving the silicide contact 580 on the second S/D terminal 246 such as that shown in FIG. 5*b*. The second metal silicide may be any suitable metal material which provides a higher SBH at the source side 246 than the metal silicide 280 on the drain side 245. Other configurations of metal silicide contacts may also be useful. For example, same type metal silicide contacts may be formed on the S/D terminals 245 and 246. In this case, one or more additional implants may be performed on the S/D terminals to implant donor-like or acceptor-like dopants to modulate SBH. For example, Al or Sb dopants may be selectively implanted into the raised S/D portion 230 on the drain side 245 to lower the SBH at the drain terminal 245 relative to the source terminal 246.

The process continues to complete the memory cell. For example, the process continues to form ILD layer, contacts plugs, storage unit 110 etc. Additional processes may be performed, including forming additional metal levels, final passivation, dicing, assembly and packaging. Techniques and materials of these features are the same as that already described in FIGS. 8*f*-8*j*. As such, details of these steps will not be described.

Figure 12A:
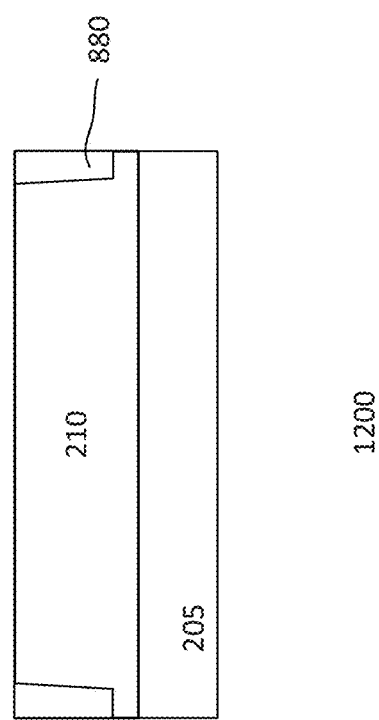
FIGS. 12a-12c show cross-sectional views of another embodiment of a process for forming a device.
Figure 12B:
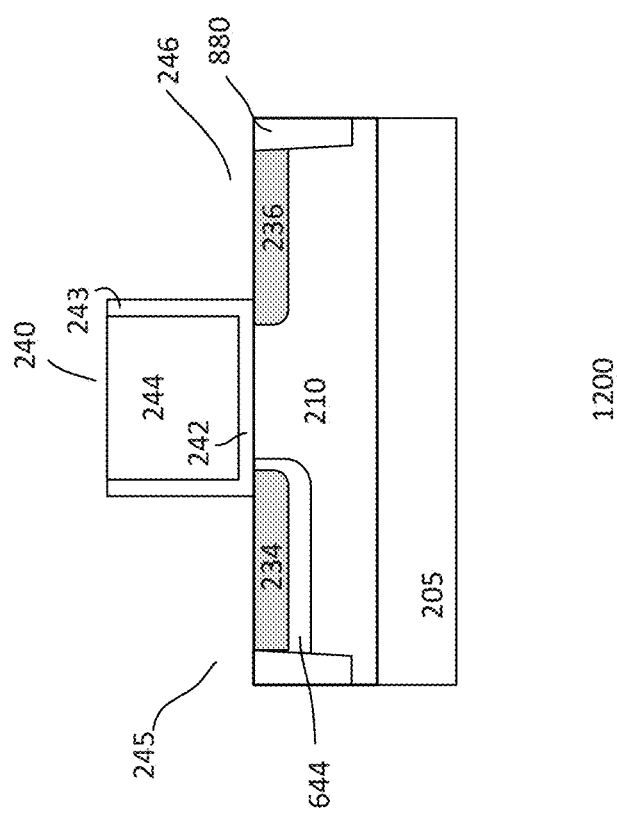
Figure 12C:
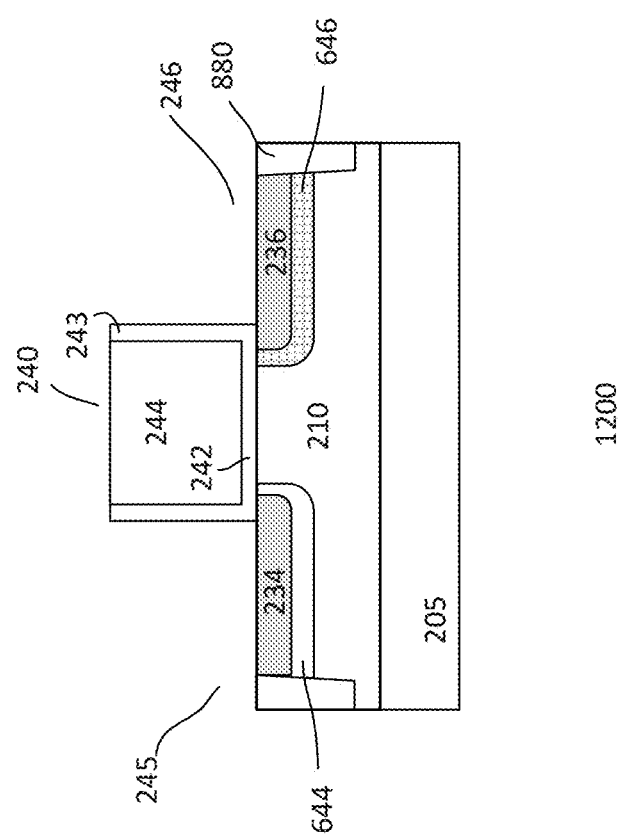

FIGS. 12*a*-12*c* show cross-sectional views of another embodiment of a process 1200 for forming a device. The device formed by process 1200, for example, is the same or similar to that described in FIGS. 6*a*-6*b* and the process may contain similar steps as that described in FIGS. 8*a*-8*j*, 9*a*-9*e*, 10*a*-10*c* and 11*a*-11*c*. In the interest of brevity, common elements may not be described or described in detail. As shown in FIG. 12*a*, the partially processed substrate is at the stage similar to that described in FIG. 8*b*.

Referring to FIG. 12*b*, a select transistor 240 of a cell selector unit is formed on the substrate. Similar to that described in FIG. 8*c*, the transistor 240 includes a gate and LDD regions 234 and 236 formed in the substrate adjacent to first and second sides of the gate. As such, details of the LDD regions and transistor gate will not be described.

In one embodiment, the process 1200 also forms asymmetrical halo regions 644 and 646 in the substrate. In one embodiment, halo implants are performed by implanting second polarity type dopants into exposed portions of the substrate. The second polarity type dopants, for example, include p-type dopants. In one embodiment, the halo implants form first and second halo regions 644 and 646 in the substrate adjacent to the first and second sides of the gate 240. For example, the halo regions extend slightly under the gate and extend beyond the LDD regions. The halo regions, for example, have a depth slightly deeper than the LDD regions.

To form the first halo region 644, a first implant mask (not shown) may be provided for a first halo implant. The first implant mask, in one embodiment, covers a portion of the substrate to protect the LDD region 236 on the source side and expose the LDD region 234 on the drain side. For example, the first implant mask covers the gate and LDD region 236 of the second S/D terminal 246. A first halo implant is performed by implanting second polarity type dopants into the exposed portion of the substrate to form the first halo region 644, as shown in FIG. 12*b*. The first halo implant, for example, is performed at an angle of 15-30 degrees with reference to the substrate surface and includes a dopant concentration of less than $1E18/cm^3$. Other suitable angles and dopant concentrations may also be useful. The first implant mask is removed, for example, by ashing.

The process 1200 continues by providing a second implant mask (not shown) for a second halo implant. The second implant mask, in one embodiment, covers a portion of the substrate to protect the LDD region 234 on the drain side and expose the LDD region 236 on the source side. For example, the second implant mask covers the gate and LDD region 234 of the first S/D terminal 245. A second halo implant is performed by implanting second polarity type dopants into the exposed portion of the substrate to form the second halo region 646, as shown in FIG. 12*c*. The second halo implant, for example, is performed at an angle of 15-30 degrees with reference to the substrate surface and includes a dopant concentration of more than $2E18/cm^3$. Other suitable angles and dopant concentrations may also be useful. The implant mask is removed, for example, by ashing. Other processes to form the first and second halo regions may also be useful. For example, the halo region 646 at the source side may be formed by multiple halo implants to include a dopant concentration that is higher than that of the halo region 644 at the drain side.

The dopant concentrations in the halo regions affect the Vt of the select transistor. As shown in FIG. 12*c*, the halo region 646 formed at the source terminal 246 or source side includes a dopant concentration that is higher than that of the halo region 644 formed at the drain terminal 245 or drain side. A halo region with higher dopant concentration produces a higher threshold voltage (VT). Thus, the source terminal 246 is provided with high threshold voltage (HVT) while the drain terminal 245 is provided with low threshold voltage (LVT).

The process continues to complete the memory cell. For example, the process continues to form raised S/D regions, metal silicide contacts, ILD layer, contacts plugs, MTJ element, etc. Additional processes may be performed, including forming additional metal levels, final passivation, dicing, assembly and packaging. Techniques and materials of these features are the same as that already described in FIGS. 8*f*-8*j* and 9*d*-9*e*. As such, details of these steps will not be described.

Although FIGS. 12*a*-12*c* illustrates a symmetrical configuration of LDD regions, it is to be understood that the first and second S/D terminals may also be provided with an asymmetrical LDD region as shown in FIG. 6*b*. For example, the first and second S/D terminals may not be provided with halo regions. An asymmetrical LDD region may be formed by providing an LDD implant mask patterned to expose the drain terminal 245 which is lightly doped with first polarity type dopant to form an LDD region 234 at the drain side while protecting the source terminal 246 or source side from the LDD implantation. This forms the device 600 shown in FIG. 6*b*. Other techniques to form an asymmetrical LDD region may also be useful.

FIGS. 13*a*-13*d* show cross-sectional views of an embodiment of a process 1300 for forming a device. The device formed by process 1300, for example, is similar to that described in FIGS. 7*a*-7*b* and the process may contain similar steps as that described in FIGS. 8*a*-8*j*, 9*a*-9*e*, 10*a*-10*c*, 11*a*-11*c* and 12*a*-12*c*. In the interest of brevity, common elements may not be described or described in detail.

Figure 13A:
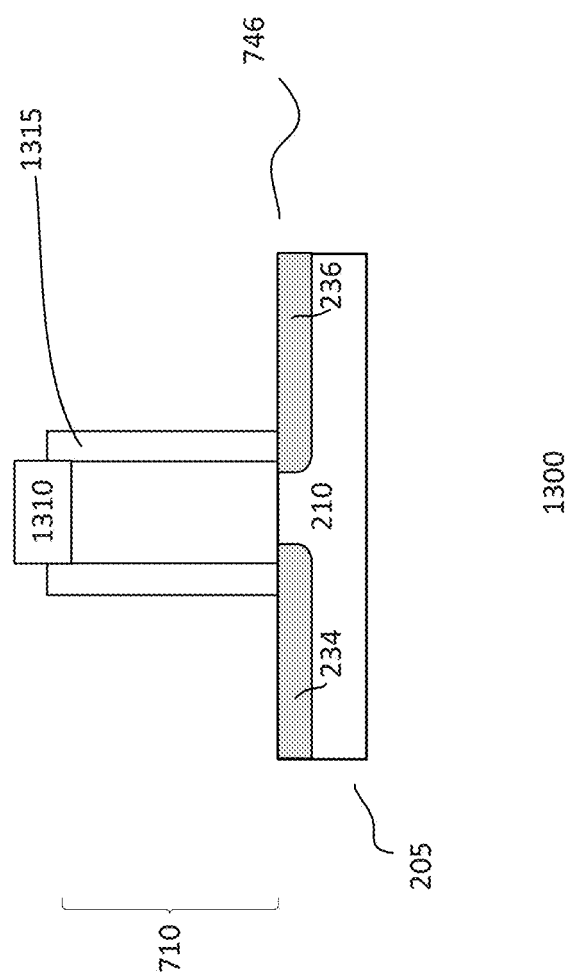
FIGS. 13a-13d show cross-sectional views of yet another embodiment of a process for forming a device.

Referring to FIG. 13*a*, a substrate 205 is provided. The substrate can include a silicon substrate, such as lightly p-type doped substrate and is defined with a p-type doped well 210. Other types of substrates may also be useful.

An implant is performed. In one embodiment, the implant forms buried SL in the substrate. Forming of the buried SL may be facilitated by an implant mask. The buried SL may be disposed along the BL direction. The buried SL is heavily doped with first polarity type dopants. For example, the dopant concentration may be about $1E18-1E20/cm^3$. In one embodiment, the first polarity type is n-type. Providing p-type as the first polarity type may also be useful. In one embodiment, the second LDD region 236 may form the buried SL. For example, the second LDD region 236 extends along the row or BL direction and serves as a common second S/D terminal 746 for a row of memory cells. Other types of buried SL may also be provided. For example, a n-type doped well region may be formed below the second LDD region 236 to form the buried SL.

In one embodiment, a semiconductor layer is formed over the substrate. The semiconductor layer may be formed by SEG process. In one embodiment, the semiconductor layer is an epitaxial crystalline layer. Other techniques for forming the semiconductor layer may also be useful. The semiconductor layer is patterned. In one embodiment, the semiconductor layer is patterned to form a nanowire base 710 for the select transistor.

Patterning the semiconductor layer, for example, may employ a patterned hard mask 1310. The patterned hard mask serves as an etch mask for an anisotropic etch, such as RIE. A hard mask layer including, for example, silicon oxide may be provided on the semiconductor layer. Other types of hard mask layers, such as silicon nitride, may also be useful. The hard mask layer is patterned using a soft mask, such as photoresist, which is exposed with the desired pattern through a photomask. To improve lithographic resolution, an ARC can be provided beneath the photoresist. The pattern of the photomask is transferred to the soft mask after development. The pattern of the soft mask is transferred to the hard mask by, for example, an anisotropic etch, such as RIE. The patterned hard mask protects portions of the semiconductor layer corresponding to the nanowire base 710. Exposed portions of the semiconductor layer are removed using, for example, by RIE, leaving the base on the substrate.

The nanowire base 710 may be the body of the select transistor. For example, the base includes a vertical channel of the transistor. Other configurations of the base may also be useful. The cross-sectional shape of a base may be circular, having a dimension of about 1F. Other shapes or dimensions may also be useful.

Sidewalls of the base may be provided with offset spacers 1315. The offset spacers may be silicon oxide spacers. Other types of spacers may also be useful. For example, the spacers may be formed from other types of materials. The offset spacers may facilitate forming LDD regions. The offset spacers, for example, protect the base 710 from the LDD implantation process. For example, an angled implant step is performed to form LDD regions 234 and 236 of the transistor. Other suitable techniques may also be used to form the LDD regions. The LDD region 236, for example, serve as the second S/D terminal 746 (or source terminal) of the vertical select transistor. The offset spacers are removed after forming the LDD regions using suitable techniques.

Figure 13B:
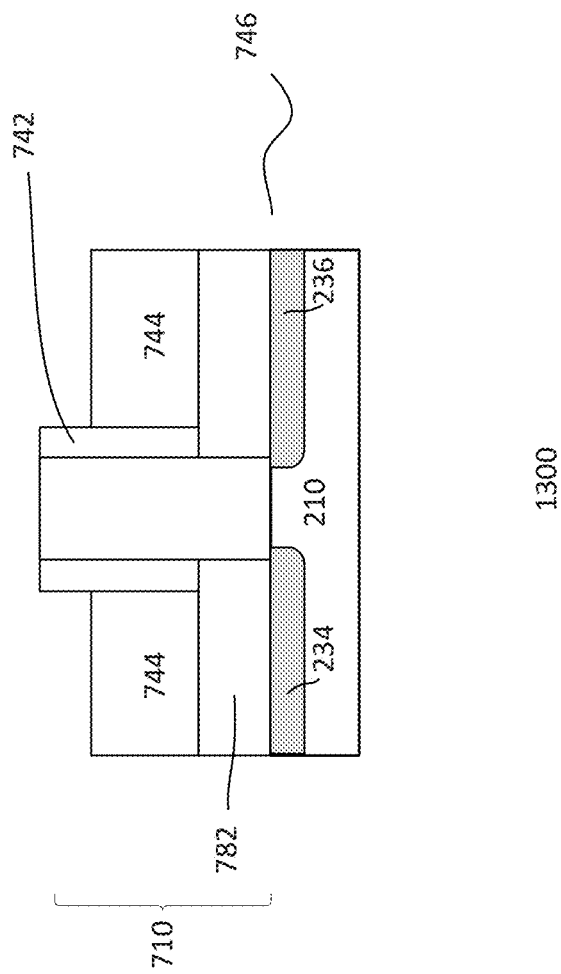

Referring to FIG. 13b, an isolation layer is provided over the LDD regions. For example, a dielectric layer is formed on the substrate. The dielectric layer, for example, may be silicon oxide. Other types of dielectric materials may also be useful. The dielectric layer may fill the spaces adjacent to the base and covers the base. Excess dielectric material over the base may be removed by, for example, a planarizing process, such as CMP. The planarizing process forms a planar surface between the dielectric layer and top of the base. In some cases, the planarizing process may also provide the base with a desired height, depending the desired height of the vertical channel. For example, the planarizing process may remove a top portion of the base to form a base 710 with the desired height. An etch back process is performed to recess the dielectric material to a thickness of about 50-500 nm from the substrate top surface, leaving the isolation layer 782 disposed on the substrate. The etch back process, for example, may be dry or wet etch.

In one embodiment, a gate dielectric layer 742 lines the sides of the base. For example, the gate dielectric layer lines the exposed sidewalls of the base 710 to form a gate dielectric. The gate dielectric layer includes, for example, silicon oxide. Various techniques may be employed to form the gate dielectric. For example, an oxide layer may be formed by thermal oxidation or by CVD. The thickness of the gate dielectric may be about 1-3 nm. Other thicknesses and techniques or combinations of techniques may be employed to form the gate dielectric. The gate dielectric 742 surrounds the vertical channel of the transistor.

A gate electrode layer 744 is deposited over the substrate after forming the gate dielectric 742. For example, a polysilicon layer is deposited by CVD. The gate electrode layer is deposited on the isolation layer 782 and covers the base 710. Other techniques for forming the gate electrode layer or other types of gate electrode layer may also be useful. Excess gate electrode material over the top of the base may be removed by, for example, a planarizing process, such as CMP. The planarizing process forms a planar surface between the gate electrode layer and top of the base.

An etch back process is performed to recess the gate electrode layer. The etch back process, for example, may be dry or wet etch. In one embodiment, the gate electrode layer is recessed to a depth from the top of the base. The thickness of the gate electrode may be about 20-100 nm. For example, the thickness of the gate electrode surrounding the base 710 may be about 30 nm (or 300 Å). This exposes a top portion of the gate dielectric layer lining the base above the gate electrode layer. For example, 10-50 nm of the gate dielectric layer 742 may be exposed above the gate electrode. This completes the formation of the gate electrode 744 of the transistor. The gate electrode 744 surrounds the gate dielectric 742 to provide a gate-all-around (GAA) transistor structure. The gate electrode may serve as a common gate electrode of select transistors along the WL direction.

Figure 13C:
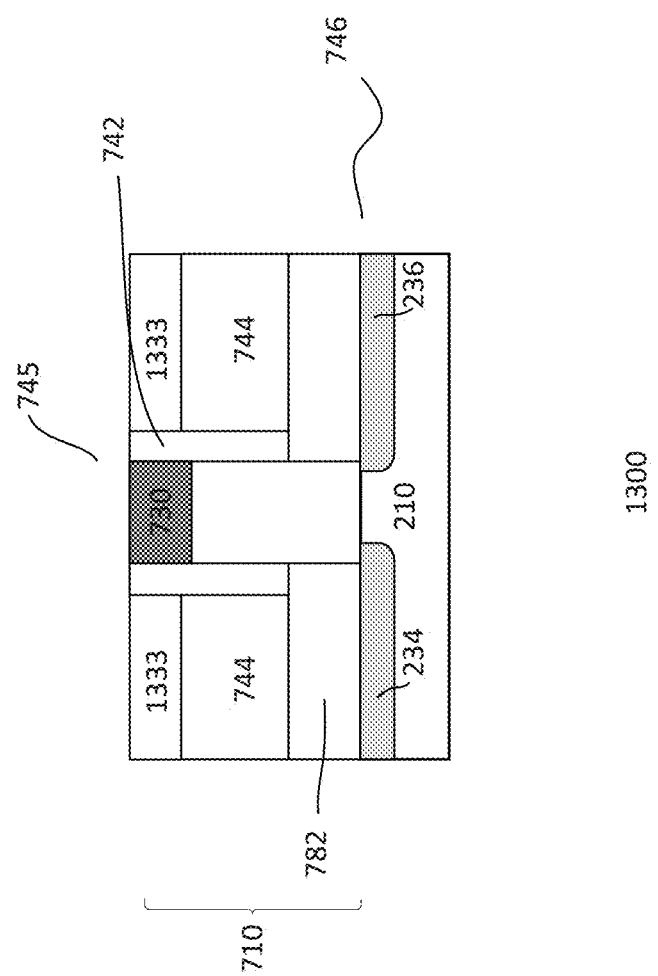

Referring to FIG. 13c, a dielectric layer 1333 is formed over the substrate. The dielectric layer may form a part of an ILD layer. The dielectric layer, for example, may be silicon oxide. Other types of dielectric materials, may also be useful. The dielectric layer fills the space adjacent to the base 710 as well as covering the top of the base. Excess dielectric material over the top of the base may be removed by, for example, a planarizing process, such as CMP. The planarizing process forms a planar surface between the dielectric layer 1333 and the base 710 and exposes the top of the base.

An implant is performed to form a heavily doped region 730 in the exposed portion of the base. In one embodiment, heavily doped first polarity type dopants are introduced to the exposed portion of the base to define the first S/D terminal 745 of the vertical select transistor. Other techniques for forming a heavily doped region may also be useful. For example, an in-situ doped epitaxial layer may also form a heavily doped region 730. An annealing process may be performed to activate the dopants in the heavily doped region 730 and lightly doped regions 234 and 236. The annealing, for example, may be rapid thermal annealing (RTA). Other types of thermal processes for activating the dopants may also be useful. As shown, the lightly doped regions 234 and 236 serve as the source terminal while the heavily doped region 730 serves as the drain terminal of the vertical select transistor.

Figure 13D:
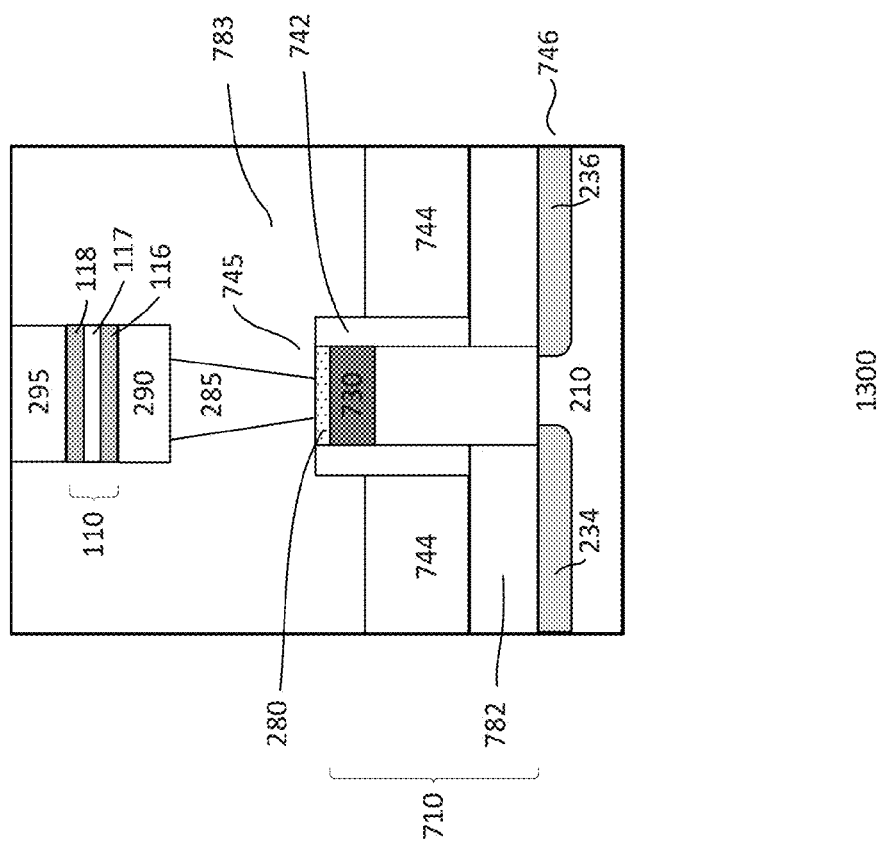

The process continues to complete the memory cell. For example, the process continues to form metal silicide contacts, ILD layer, contact plugs, MTJ element, etc. until a device such as that shown in FIG. 13d is formed. For example, metal silicide contact is formed over the heavily doped region 730 and a contact plug 285 couples the heavily doped region to the MTJ stack 110 and to the BL. Additional processes may be performed, including forming additional metal levels, final passivation, dicing, assembly and packaging. Techniques and materials of these features are the same as that already described in FIGS. 8f-8j. As such, details of these steps will not be described.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory cell comprising:
   a crystalline-on-insulator (COI) substrate, wherein the COI substrate includes a surface crystalline layer which is separated from a bulk crystalline by a buried insulator layer;
   a select transistor on the COI substrate, wherein the select transistor includes a gate disposed over the substrate and between first and second source/drain (S/D) terminals, wherein
      a first and second sidewall of the gate is completely covered by dielectric liners,
         dielectric spacers are disposed adjacent to the first and second sidewalls of the gate, wherein each dielectric spacer covers a side of the dielectric liners, and
         the first and second S/D terminals are asymmetric S/D terminals and are configured such that a resistance at the second S/D terminal is higher than a resistance at the first S/D terminal;
   a ground plane structure disposed below the buried insulator layer and within the bulk crystalline layer of the COI substrate;
   a dielectric layer disposed over the COI substrate, wherein the dielectric layer comprises a plurality of inter level dielectric (ILD) layers, a lower portion of the dielectric layer includes a first contact level and a first metal level, wherein a first contact plug disposed within the first contact level connects the first S/D terminal to a first metal line in the first metal level; and
   a magnetic tunnel junction (MTJ) element disposed directly on and in contact with a top of the first metal line.

2. The memory cell of claim 1 wherein the first contact level comprises a second contact plug connecting the second S/D terminal to a second metal line disposed in the first metal level, wherein the second metal line is a source line (SL).

3. The memory cell of claim 1 wherein the first and second S/D terminals include first and second lightly doped diffusion (LDD) regions underlapping a portion of first and second sides of the gate.

4. The memory cell of claim 3 wherein the first S/D terminal includes a heavily doped raised S/D portion disposed over the LDD region and the second S/D terminal is devoid of a heavily doped raised S/D portion.

5. The memory cell of claim 3 wherein each of the first and second S/D terminals includes a heavily doped raised S/D portion over a heavily doped base S/D portion.

6. The memory cell of claim 5 wherein each of the raised S/D portions of the first and second S/D terminals comprises a heavily doped epitaxial layer disposed on the COI substrate and over the base S/D portion.

7. The memory cell of claim 5 wherein the ground plane structure comprises a local ground plane (LGP) underlapping the first or second S/D terminal.

8. The memory cell of claim 7 wherein the LGP underlaps the first S/D terminal without underlapping the second S/D terminal, wherein the LGP comprises same polarity type dopants as the heavily doped base S/D portion of the first.

9. The memory cell of claim 7 wherein the LGP underlaps the second S/D terminal without underlapping the first S/D terminal, wherein the LGP comprises different polarity type dopants from the heavily doped base S/D portion of the second S/D terminal.

10. The memory cell of claim 3 wherein each of the first and second S/D terminals comprises a heavily doped epitaxial layer disposed on the COI substrate, wherein the heavily doped epitaxial layer defines a raised S/D portion of each of the first and second S/D terminals.

11. The memory cell of claim 10 comprising a metal silicide disposed on each raised S/D portion of the first and second S/D terminals, wherein an interface of each metal silicide and S/D portion includes a Schottky Barrier Height (SBH), wherein the SBH of the first S/D terminal is lower than the SBH of the second S/D terminal.

12. The memory cell of claim 10 wherein each of the first and second S/D terminals is devoid of a heavily doped base S/D portion disposed in the COI substrate.

13. The memory cell of claim 1 wherein the second S/D terminal is a source terminal and the first S/D terminal is a drain terminal, wherein the higher resistance at the source terminal relative to the resistance at the drain terminal leads to unequal bidirectional write currents flowing through the memory cell during write operations.

14. The memory cell of claim 3 wherein the first and second S/D terminals are devoid of a heavily doped diffusion region disposed within the surface crystalline layer of the COI substrate.

15. The memory cell of claim 4 comprising:
    a first metal silicide contact disposed on the raised S/D portion of the first S/D terminal; and
    a second metal silicide contact disposed directly on the LDD region of the second S/D terminal, wherein the second metal silicide contact is in contact with the surface crystalline layer of the COI substrate.

16. The memory cell of claim 1 wherein the ground plane structure extends to underlap the gate and the first and second S/D terminals of the select transistor.

17. A memory cell comprising:
    a crystalline-on-insulator (COI) substrate, wherein the COI substrate includes a surface crystalline layer which is separated from a bulk crystalline layer by a buried insulator layer;
    a select transistor on the substrate, the select transistor includes a gate disposed over the substrate between first and second source/drain (S/D) terminals, wherein the first and second S/D terminals are asymmetric S/D terminals and are configured such that a resistance at the second S/D terminal is higher than a resistance at the first S/D terminal;

a dielectric layer disposed over the substrate, wherein the dielectric layer comprises a plurality of inter level dielectric (ILD) layers, a lower portion of the dielectric layer includes a first contact level and a first metal level, a first contact plug disposed within the first contact level connects the first S/D terminal to a first metal line in the first metal level;

a magnetic tunnel junction (MTJ) element disposed directly on and in contact with a top of the first metal line; and wherein a ground plane structure is disposed below the buried insulator layer, wherein a top of the ground plane structure is contiguous with a bottom of the insulator layer and the ground plane structure extends across cell regions to underlap the entire buried insulator layer.

18. A memory cell comprising:

a substrate;

a select transistor on the substrate, wherein the select transistor comprises a gate disposed over the substrate, wherein a source terminal and a drain terminal of the select transistor are disposed adjacent to first and second sides of the gate, wherein the source and drain terminals comprise an asymmetrical configuration, wherein the source terminal is configured with a higher resistance relative to a resistance at the drain terminal, wherein the drain terminal is defined by a lightly doped drain portion and a heavily doped drain portion, wherein the lightly doped drain portion is disposed within the substrate and adjacent to the first side of the gate, and the heavily doped drain portion is disposed on the substrate, wherein the heavily doped drain portion is positioned completely over the lightly doped drain portion;

a dielectric layer disposed over the substrate, wherein the dielectric layer comprises a plurality of inter level dielectric (ILD) layers, wherein a lower portion of the dielectric layer comprises a first contact level and a first metal level over the first contact level, wherein a first contact plug is disposed in the first contact level and a first metal pad is disposed in the first metal level; and a magnetic tunnel junction (MTJ) element disposed over the first contact level, wherein the first metal pad and the first contact plug directly couples the MTJ element to the drain terminal of the select transistor.

19. The memory cell of claim 18 wherein:

the heavily doped drain portion includes a heavily doped epitaxial layer disposed on a top surface of the substrate, wherein the drain terminal is devoid of a heavily doped drain portion disposed below the top surface of the substrate; and the source terminal comprises a lightly doped source portion disposed within the substrate and adjacent to the second side of the gate, wherein the source terminal is devoid of a heavily doped source portion disposed below the top surface of the substrate.

20. The memory cell of claim 18 wherein the source terminal comprises a lightly doped source portion disposed within the substrate and adjacent to the second side of the gate, wherein the source terminal is devoid of a heavily doped source portion disposed in the substrate.

* * * * *